United States Patent [19]
Fujioka

[11] Patent Number: 5,923,198
[45] Date of Patent: Jul. 13, 1999

[54] HIGH-SPEED CLOCK-SYNCHRONOUS SEMICONDUCTOR INTEGRATED CIRCUIT AND SEMICONDUCTOR INTEGRATED CIRCUIT SYSTEM

[75] Inventor: Shinya Fujioka, Kawasaki, Japan

[73] Assignee: Fujitsu Limited, Kanagawa, Japan

[21] Appl. No.: 08/978,373

[22] Filed: Nov. 25, 1997

[30] Foreign Application Priority Data

Jul. 11, 1997 [JP] Japan .................................. 9-186699

[51] Int. Cl.⁶ .................................................. H03H 11/26
[52] U.S. Cl. .............................. 327/262; 327/2; 327/141
[58] Field of Search .................................. 327/2, 7, 141, 327/160, 161, 231, 233, 237, 241, 250, 251, 252, 253, 261, 262, 269, 270

[56] References Cited

U.S. PATENT DOCUMENTS 5,268,936 12/1993 Bernardy ................................ 375/118

*Primary Examiner*—Timothy P. Callahan
*Assistant Examiner*—Jeffrey Zweizig
*Attorney, Agent, or Firm*—Nikaido Marmelstein Murray & Oram LLP

[57] ABSTRACT

A semiconductor integrated circuit has a de-skew circuit for reducing a skew of an incoming signal from a specific circuit with respect to a synchronous clock signal. The de-skew circuit controls the phase of an outgoing signal to be transmitted from the semiconductor integrated circuit to the specific circuit in response to the skew of the input signal. This arrangement decreases not only a skew of incoming signals from the specific circuit but also a skew of outgoing signals to the specific circuit.

24 Claims, 20 Drawing Sheets

(DIFFERENT TRANSMISSION SPEEDS IN INDIVIDUAL LINES)

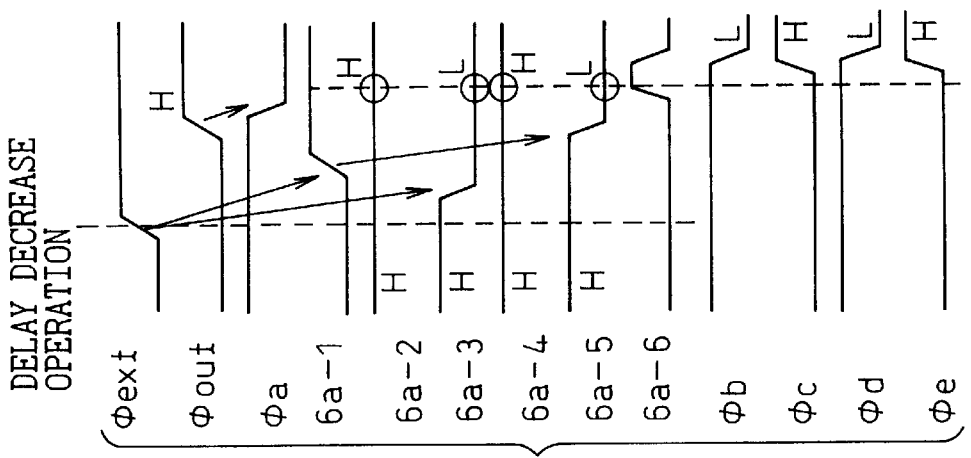
Fig.15C DELAY DECREASE OPERATION
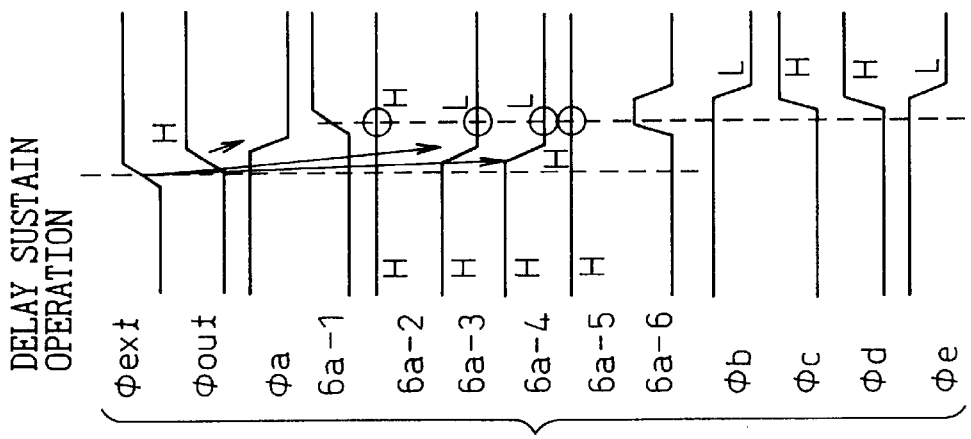
Fig.15B DELAY SUSTAIN OPERATION
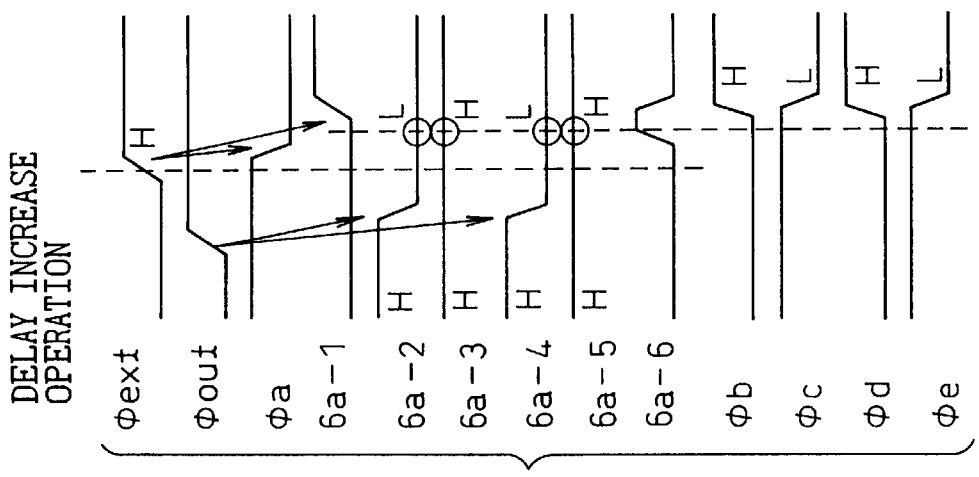
Fig.15A DELAY INCREASE OPERATION

HIGH-SPEED CLOCK-SYNCHRONOUS SEMICONDUCTOR INTEGRATED CIRCUIT AND SEMICONDUCTOR INTEGRATED CIRCUIT SYSTEM

BACKGROUND OF THE INVENTION

1. Field of the Invention

The present invention relates to a semiconductor integrated circuit and a semiconductor integrated circuit system, and particularly, to a high-speed clock-synchronous semiconductor integrated circuit.

2. Description of the Related Art

The operating frequencies of CPUs (central processing units) or the frequencies of clock signals to drive CPUs are increasing rapidly, and therefore, memories such as DRAMs (dynamic random access memories) connected to the CPUs must operate at high speed.

There have been proposed high-speed DRAMs such as DDR (double data rate) DRAMs that are accessible in response to not only rises of a clock signal but also falls thereof.

When access intervals and clock frequencies for a system having a CPU and a memory are made faster, the difference in wiring load between a data bus and a clock line between the CPU and the memory causes a skew of signals transmitted through the data bus with respect to a clock signal transmitted through the clock line. It is necessary to provide a semiconductor integrated circuit that is capable of reducing such a skew of signals.

The related art high-speed clock-synchronous semiconductor integrated circuit and problems associated with the related art semiconductor integrated circuit will be described in detail later with reference to the drawings.

SUMMARY OF THE INVENTION

An object of the present invention is to provide a semiconductor integrated circuit that is capable of reducing a skew among incoming signals as well as a skew among outgoing signals.

According to the present invention, there is provided a semiconductor integrated circuit comprising a de-skew circuit for reducing a skew of an input signal transmitted from a specific circuit with respect to a synchronous clock signal, wherein the de-skew circuit controls a phase of an output signal to be transmitted from the semiconductor integrated circuit to the specific circuit in response to the skew of the input signal.

The de-skew circuit may comprise an input delay circuit for imposing a delay on the input signal, to cancel the skew of the input signal; and an output delay circuit for imposing, on the output signal, the same delay as that imposed by the input delay circuit. Each of the input and output delay circuits may form a delay locked loop circuit. The de-skew circuit may further comprise a phase comparison circuit for detecting the skew of the input signal; and a shift register for setting the same delay in the input and output delay circuits according to the detected skew. The semiconductor integrated circuit may execute a calibration mode to correct the skew of the input signal.

The semiconductor integrated circuit may transmit a timing signal together with the output signal to the specific circuit. The semiconductor integrated circuit may execute a calibration mode to correct a skew of the timing signal with respect to the synchronous clock signal. The specific circuit may transmit a timing signal to the semiconductor integrated circuit in the calibration mode.

The de-skew circuit may further comprise an input delay circuit for imposing a delay on the timing signal transmitted from the specific circuit in the calibration mode, to cancel a skew of the timing signal with respect to the synchronous clock signal; and an output delay circuit for imposing, on the timing signal transmitted from the semiconductor integrated circuit to the specific circuit, the same delay as that imposed by the input delay circuit. Each of the input and output delay circuits for the timing signals may form a delay locked loop circuit. The de-skew circuit may further comprise a phase comparison circuit for detecting the skew of the timing signal transmitted from the specific circuit; and a shift register for setting the same delay in the input and output delay circuits for the timing signals according to the detected skew. The specific circuit may be a central processing unit (CPU) and the semiconductor integrated circuit may be a memory connected to the central processing unit through buses.

Further, according to the present invention, there is also provided a semiconductor integrated circuit system having a plurality of semiconductor integrated circuits and a specific circuit, each of the semiconductor integrated circuits including a de-skew circuit for reducing a skew of an input signal transmitted from the specific circuit with respect to a synchronous clock signal, wherein the de-skew circuit controls a phase of an output signal to be transmitted from the semiconductor integrated circuit to the specific circuit in response to the skew of the input signal.

BRIEF DESCRIPTION OF THE DRAWINGS

The present invention will be more clearly understood from the description of the preferred embodiments as set forth below with reference to the accompanying drawings, wherein:

FIGS. 15A, 15B, and 15C are timing charts showing the operation of the phase comparator of FIG. 14;

DESCRIPTION OF THE PREFERRED EMBODIMENTS

For a better understanding of the preferred embodiments of the present invention, the problem in the prior art will be explained.

Figure 1:
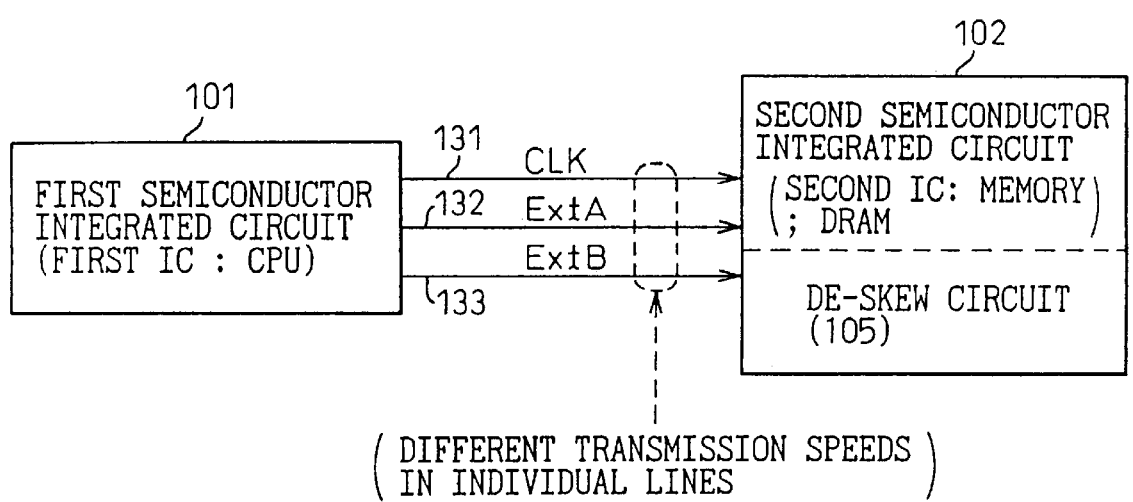
FIG. 1 is a block diagram showing a system including a CPU and a semiconductor integrated circuit according to a prior art.

FIG. 1 is a block diagram showing a system having a CPU 101 serving as a first semiconductor integrated circuit and a second semiconductor integrated circuit 102, which is a memory such as a DRAM.

The CPU 101 and memory 102 are connected to each other through a clock line 131 for transmitting a synchronous clock signal CLK, a data bus 132 for transmitting data ExtA, and a data bus 133 for transmitting data ExtB.

When the frequency of the clock signal CLK exceeds a hundred megahertz, the difference in speed, delay time, and phase between signals transmitted through the clock line 131 and the data buses 132 and 133 is not ignorable. Such difference is caused by the difference in wiring load between the clock line 131 and the data buses 132 and 133.

The difference or skew of the data ExtA and ExtB from the clock signal CLK at the memory 102 prevents an improvement in the operation speed of the memory 102.

To reduce the skew, the prior art provides the memory 102 with a de-skew circuit 105.

Figure 2:
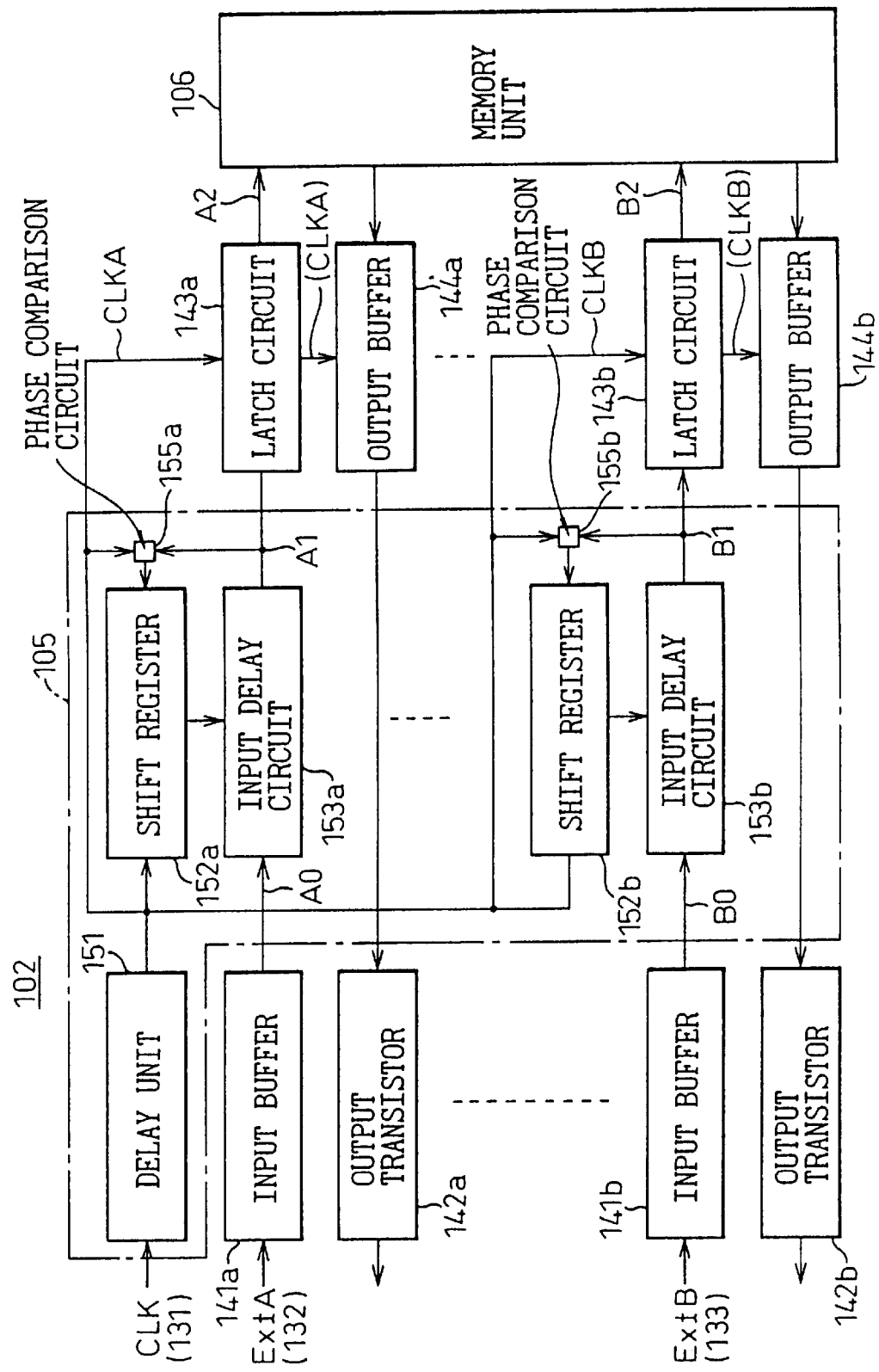
FIG. 2 is a block diagram showing the details of the circuit of FIG. 1.

FIG. 2 is a block diagram showing the details of the memory 102 having the de-skew circuit 105. In addition to the de-skew circuit 105, the memory 102 has a memory unit 106, input buffers 141a and 141b, output transistors 142a and 142b, latches 143a and 143b, and output buffers 144a and 144b.

The de-skew circuit 105 has shift registers 152a and 152b, input delay circuits 153a and 153b, and phase comparison circuits 155a and 155b, to reduce a skew of data such as write data ExtA and ExtB transmitted from the CPU 101 through the data buses 132 and 133 with respect to a clock signal CLK transmitted through the clock line 131. The numbers of the shift registers 152a and 152b, input delay circuits 153a and 153b, and phase comparison circuits 155a and 155b are dependent on the number of the data buses 132 and 133.

The data buses 132 and 133 transmit the data ExtA and ExtB to the input buffers 141a and 141b, which provide signals A0 and B0 to the input delay circuits 153a and 153b. These delay circuits provide output signals A1 and B1 to the latches 143a and 143b. Each of the delay circuits 153a and 153b is a part of a DLL (delay locked loop) circuit. A delay time or the number of delay elements activated in any one of the delay circuits 153a and 153b is determined by a corresponding one of the shift registers 152a and 152b. A value set in any one of the shift registers 152a and 152b for setting the number of active delay elements in the corresponding delay circuit is determined to minimize a skew or a phase difference of the output of the corresponding delay circuit with respect to the clock signal CLK passed through a delay unit 151.

The delay unit 151 delays the clock signal CLK behind the data signals ExtA and ExtB, so that the data signals ExtA and ExtB are delayed by the input delay circuits 153a and 153b and synchronized with the delayed clock signal CLK. Comparing the clock signal CLK with the outputs of the delay circuits 153a and 153b and selecting the numbers of delay elements in the delay circuits 153a and 153b through the shift registers 152a and 152b are carried out only in a calibration mode.

Figure 3:
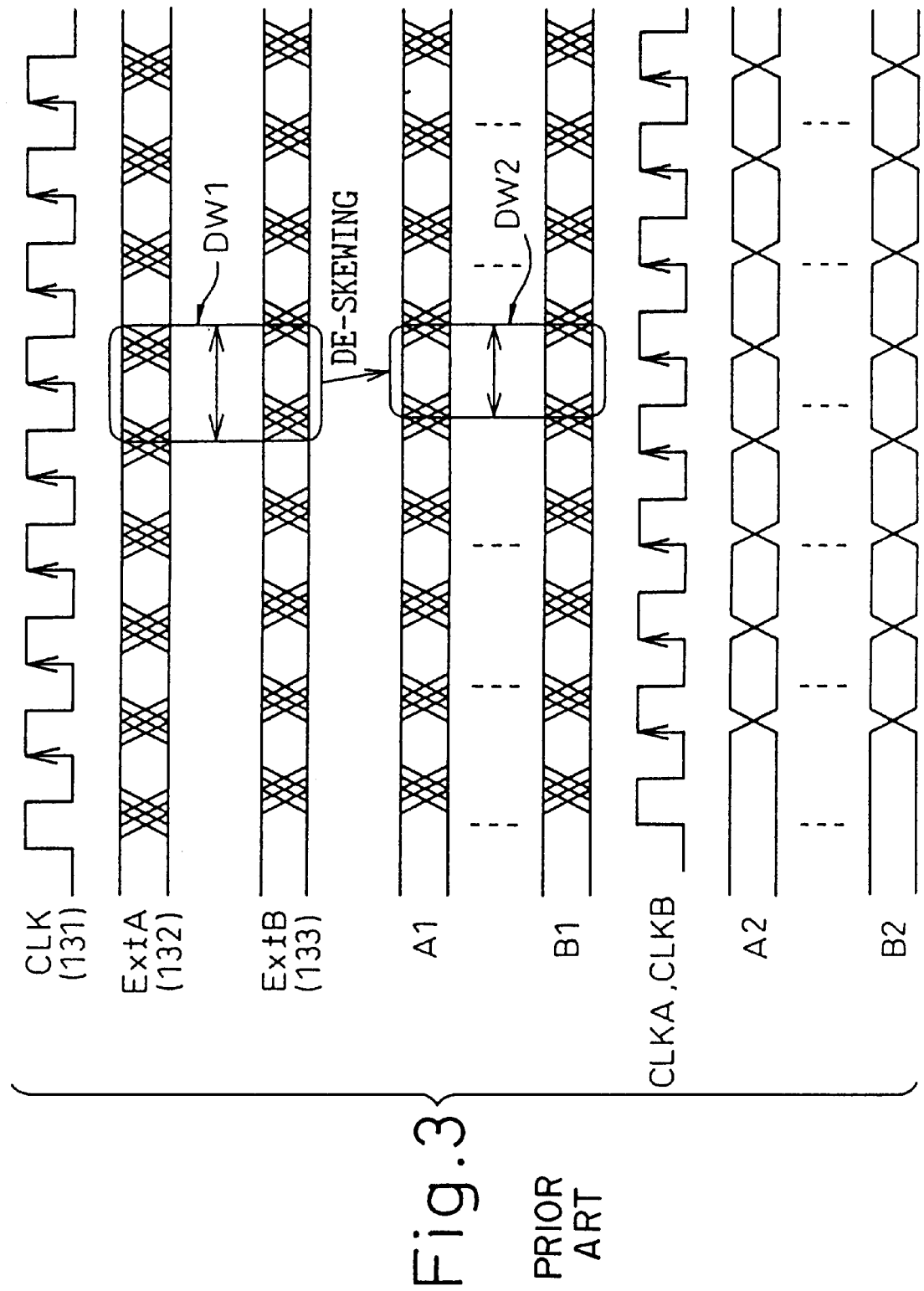
FIG. 3 is a timing chart showing the operation of a de-skew circuit contained in the circuit of FIG. 2.

FIG. 3 is a timing chart showing the operation of the de-skew circuit 105 of FIG. 2.

The de-skew circuit 105 reduces a skew of the data ExtA and ExtB from the clock signal CLK and provides latches 143a and 143b with clock signals CLKA and CLKB and data signals A1 and B1. The data signals A1 and B1 have substantially no skew with respect to the clock signals CLKA and CLKB. Namely, the de-skew circuit 105 narrows a data window from DW1 to DW2 as shown in FIG. 3. Consequently, a period for holding output signals A2 and B2 of the latches 143a and 143b is shortened to improve an operation speed.

Data read out of the memory unit 106 are passed through the output buffers 144a and 144b, output transistors 142a and 142b, and data buses 132 and 133 to the CPU 101.

The de-skew circuit 105 of the prior art functions only on write data transmitted from the CPU 101 to the memory 102. Namely, the prior art achieves no de-skew operation on data read out of the memory 102 and transferred to the CPU 101. Consequently, the CPU 101 may receive skewed data from the memory 102.

To solve this problem, the CPU 101 may have a de-skew circuit. If the CPU 101 is designed to receive data from several memory ICs or memory modules and if the de-skew circuit thereof is designed to handle a fixed skew, the de-skew circuit is unable to handle different skews related to data from the different memory ICs. If the de-skew circuit must handle a certain range of skews, it must have a large capacity to increase the size thereof.

Next, the embodiments of the present invention will be explained.

Figure 4:
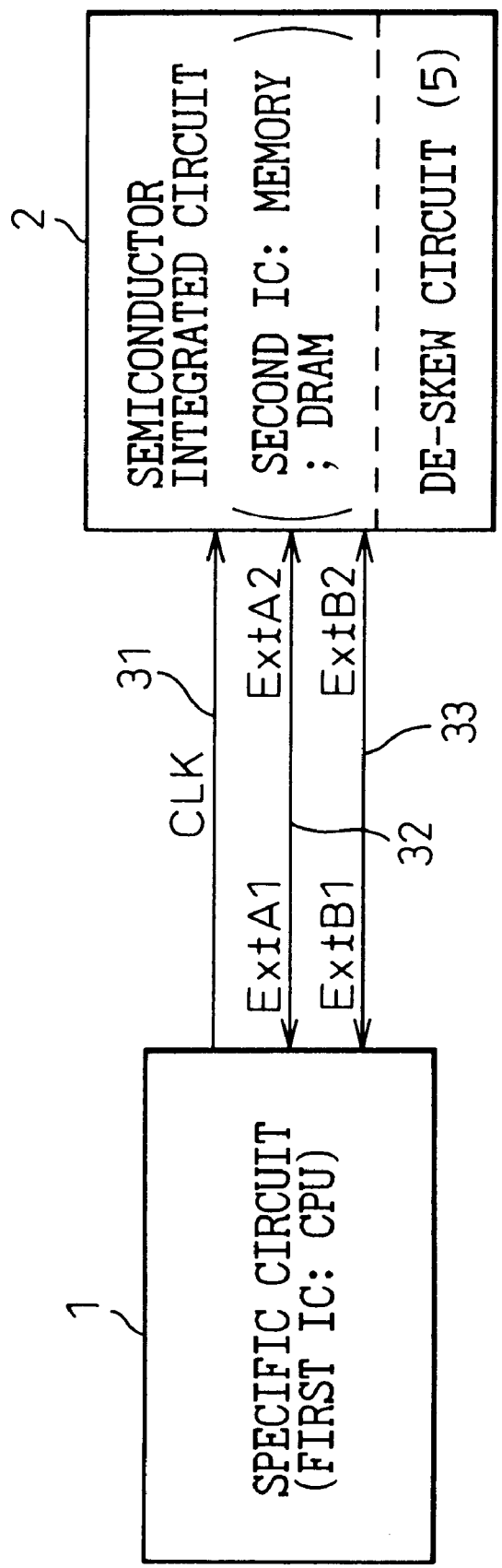
FIG. 4 is a block diagram showing a system including a CPU and a semiconductor integrated circuit according to an embodiment of the present invention.

FIG. 4 is a block diagram showing a system having a CPU serving as a first semiconductor integrated circuit (first IC 1) and a second semiconductor integrated circuit (second IC 2). The second IC 2 is a memory such as a DRAM and has a de-skew circuit 5 according to an embodiment of the present invention.

The CPU (first IC) 1 and memory (second IC) 2 are connected to each other through a clock line 31 for transmitting a synchronous clock signal CLK and data buses 32 and 33 for transmitting data ExtA1, ExtA2, ExtB1, and ExtB2. The data ExtA1 and ExtB1 are at an I/O port of the CPU 1. On the CPU 1 side, outgoing signals from the CPU 1 to the data buses 32 and 33 involve no delay nor skew, and incoming signals from the memory 2 involve delay and skew due to the data buses 32 and 33. The data ExtA2 and ExtB2 are at an I/O port of the memory 2. On the memory 2 side, incoming signals from the CPU 1 involve delay and skew due to the data buses 32 and 33, and outgoing data to the data buses 32 and 33 involve no delay nor skew.

Figure 5:
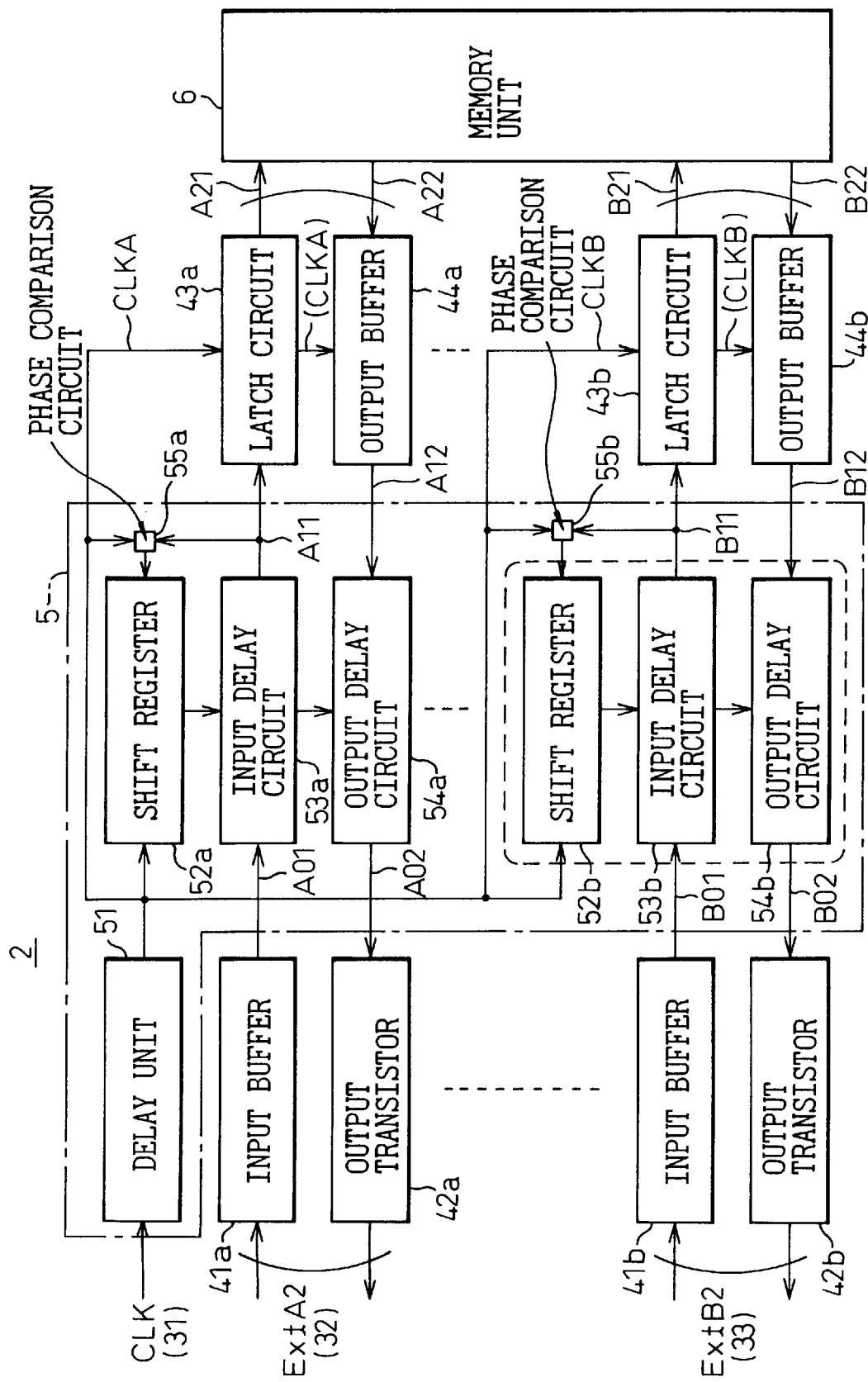
FIG. 5 is a block diagram showing the details of the circuit of FIG. 4.

FIG. 5 is a block diagram showing the details of the memory 2. The memory 2 has the de-skew circuit 5, a memory unit 6, input buffers 41a and 41b, output transistors 42a and 42b, latches 43a and 43b, and output buffers 44a and 44b.

To reduce a skew of the data (write data) ExtA2 and ExtB2 transmitted through the data buses 32 and 33 with respect to the clock signal CLK transmitted through the clock line 31, the de-skew circuit 5 has shift registers 52a and 52b, input delay circuits 53a and 53b, and phase comparison circuits 55a and 55b. According to the embodiment, the de-skew circuit 5 also has output delay circuits 54a and 54b between the output buffers 44a and 44b and the output transistors 42a and 42b. The numbers of the shift registers 52a and 52b, input delay circuits 53a and 53b, phase comparison circuits 55a and 55b, and output delay circuits 54a and 54b are dependent on the numbers of the data buses 32 and 33.

The data buses 32 and 33 supply the data ExtA2 and ExtB2 to the input buffers 41a and 41b, which supply signals A01 and B01 to the input delay circuits 53a and 53b. The delay circuits 53a and 53b provide output signals A11 and B11 to the latches 43a and 43b. The number of delay elements activated in the input delay circuits 53a and 53b are determined by the shift registers 52a and 52b. Values set in the shift registers 52a and 52b for determining the numbers of delay elements activated in the delay circuits 53a and 53b are determined to minimize skews that are detected from comparison results provided by the phase comparison circuits 55a and 55b that compare the clock signal CLK passed through a delay unit 51 with the outputs of the delay circuits 53a and 53b.

The delay unit 51 delays the clock signal CLK behind the data ExtA2 and ExtB2, so that the input delay circuits 53a and 53b may delay the data ExtA2 and ExtB2 and synchronize them with the clock signal CLK. Comparing the clock signal CLK with the outputs of the delay circuits 53a and 53b and setting values in the shift registers 52a and 52b are carried out only in a calibration mode.

The operation of the de-skew circuit 5 on the data (write data) transmitted from the CPU 1 to the memory 2 is the same as that of the de-skew circuit 105 of FIGS. 2 and 3. Namely, the de-skew circuit 5 reduces a skew of the data ExtA2 and ExtB2 with respect to the clock signal CLK. As a result, a period for holding output signals A21 and B21 of the latches 43a and 43b is shortened to improve an operation speed.

The de-skew circuit 5 is characterized by the output delay circuits 54a and 54b arranged between the output buffers 44a and 44b and the output transistors 42a and 42b. Delays in the delay circuits 54a and 54b are set to be equal to those in the input delay circuits 53a and 53b. More precisely, the shift register 52a sets the same number of delay elements to be activated in the input and output delay circuits 53a and 54a, and the shift register 52b sets the same number of delay elements to be activated in the input and output delay circuits 53b and 54b. The details of components that form the de-skew circuit 5 will be explained later with reference to FIGS. 10 to 20.

According to a skew of data transmitted from the CPU 1 to the memory 2 with respect to the synchronous clock signal CLK, the present invention shifts the output timing of data to be transmitted from the memory 2 to the CPU 1, thereby reducing a skew of data ExtA1 and ExtB1 arrived at the CPU 1.

Figure 6:
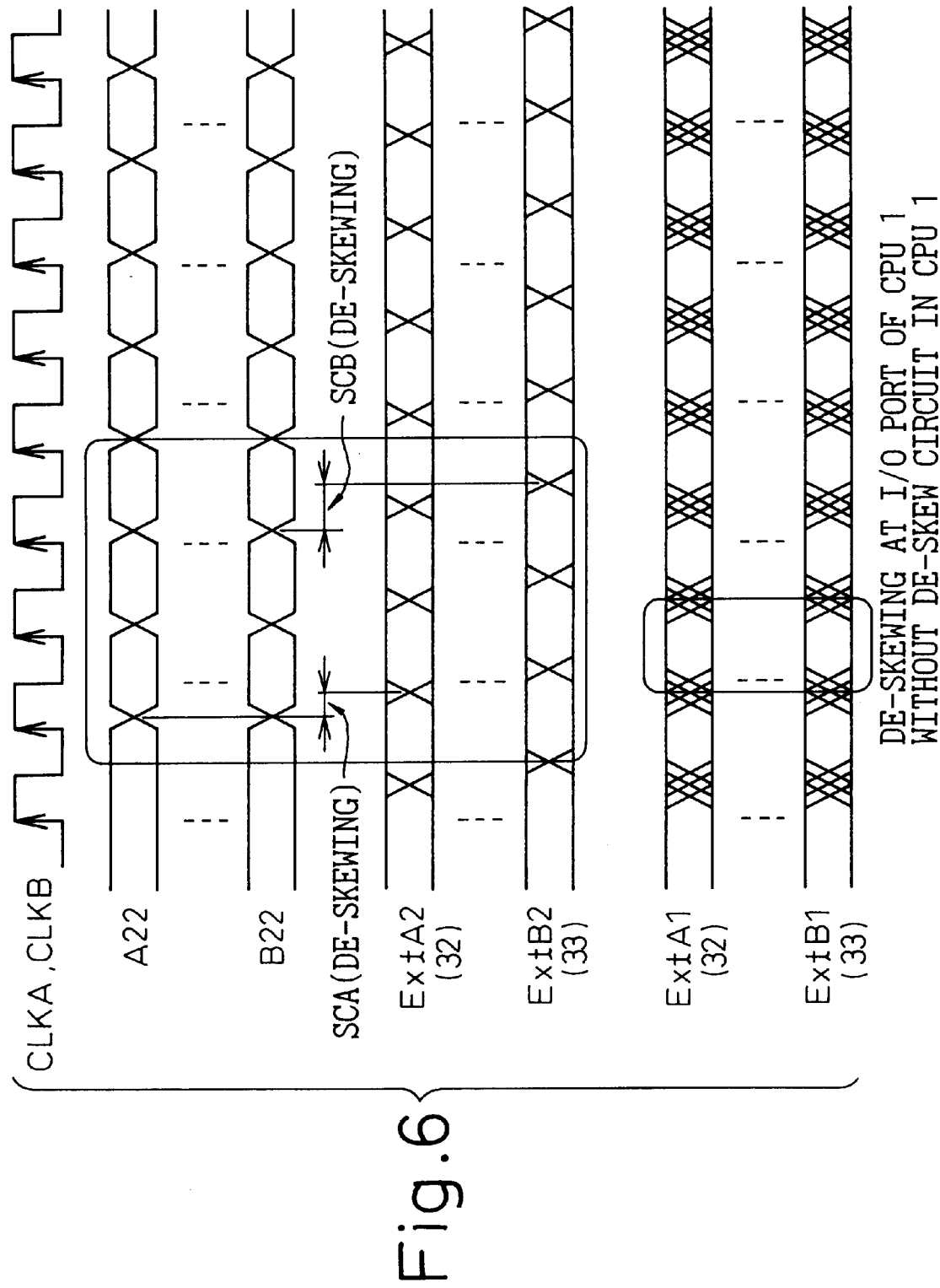
FIG. 6 is a timing chart showing the operation of a de-skew circuit contained in the circuit of FIG. 5.

FIG. 6 is a timing chart showing the operation of the de-skew circuit 5 with regard to data transmitted from the memory unit 6 to the CPU 1.

Data A22 and B22 read out of the memory unit 6 are stored in the output buffers 44a and 44b. In synchronization with clock signals CLKA and CLKB, the output buffers 44a and 44b provide signals A12 and B12 to the output delay circuits 54a and 54b. The output delay circuit 54a delays the signal A12 by the same delay as that of the input delay circuit 53a and provides a delayed output signal A02. The output delay circuit 54b delays the signal B12 by the same delay as that of the input delay circuit 53b and provides a delayed output signal B02.

As a result, data ExtA2 that is at the I/O port of the memory 2 and is to be transmitted to the CPU 1 through the data bus 32 is delayed by SCA that corresponds to a skew to occur in the data bus 32 with respect to the clock line 31. Similarly, data ExtB2 that is at the I/O port of the memory 2 and is to be transmitted to the CPU 1 through the data bus 33 is delayed by SCB that corresponds to a skew to occur in the data bus 33 with respect to the clock line 31. As a result, data ExtA1 and ExtB1 originated from the data ExtA2 and ExtB2 and arriving at the CPU 1 have each a reduced skew with respect to the clock signal CLK. This also reduces a skew between the data ExtA1 and ExtB1. Namely, the present invention reduces skews without arranging a de-skew circuit in the CPU 1 or with arranging a de-skew circuit having a short delay time (a small number of delay elements) in the CPU 1.

Figure 7:
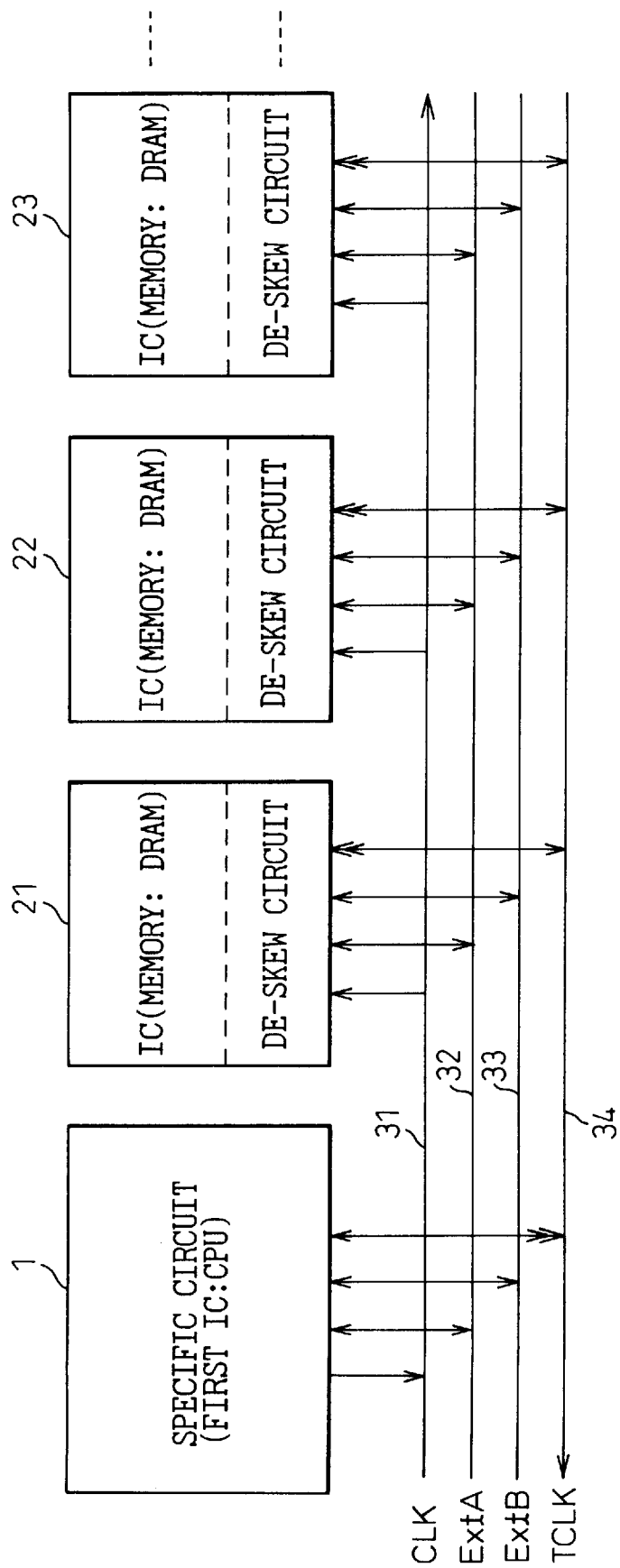
FIG. 7 is a block diagram showing a system including a CPU and semiconductor integrated circuits according to another embodiment of the present invention.
Figure 8:
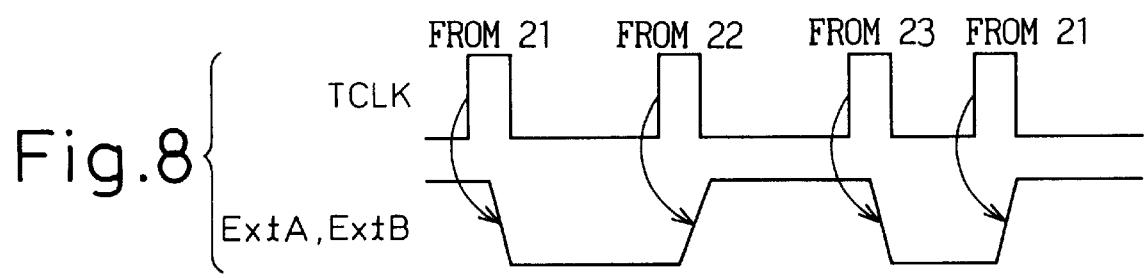
FIG. 8 is a timing chart showing the operation of the system of FIG. 7.

FIG. 7 is a block diagram showing a system having a CPU 1 serving as a first semiconductor integrated circuit (first IC) and memories (DRAMs) 21 to 23 according to another embodiment of the present invention, and FIG. 8 is a timing chart showing the operation of the system of FIG. 7.

Unlike the embodiment of FIGS. 4 to 6 that connects a single memory to a single CPU, the embodiment of FIG. 7 connects a plurality of memories to a CPU. Since the memories 21 to 23 are arranged at different positions, they have different data transmission periods with respect to the CPU 1.

Accordingly, the system employs a timing signal line 34 between the CPU 1 and the memories 21 to 23. When the CPU 1 sends write data to the memories 21 to 23, it simultaneously sends a timing signal TCLK to the memories 21 to 23 through the line 34. On the other hand, when the memories send read data to the CPU 1, they simultaneously send a timing signal TCLK to the CPU 1 through the line 34.

As a result, the CPU 1 receives the data from the memories 21 to 23 in synchronization with the timing signal TCLK sent therefrom, as shown in FIG. 8.

Figure 9:
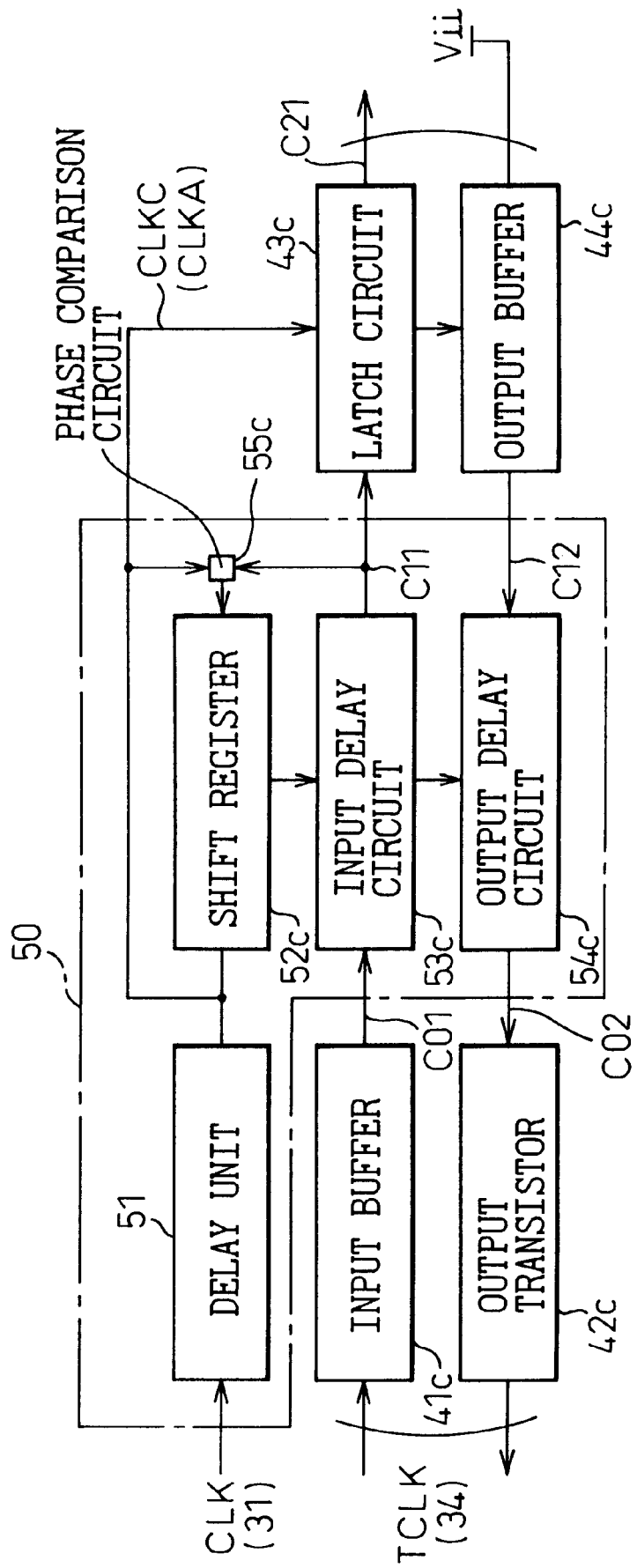
FIG. 9 is a block diagram showing an essential part of one of the semiconductor integrated circuits of FIG. 7.

FIG. 9 is a block diagram showing an essential part of one of the memories 21 to 23 of FIG. 7.

The timing signal TCLK involves a skew with respect to the synchronous clock signal CLK. Accordingly, in addition to a de-skew circuit for correcting a skew of data signals (ExtA and ExtB) with respect to the clock signal CLK, the memory has a de-skew circuit 50 composed of a delay unit 51, a shift register 52c, an input delay circuit 53c, an output delay circuit 54c, and a phase comparison circuit 55c, for correcting a skew of the timing signal TCLK with respect to the clock signal CLK. According to information about a skew of the timing signal TCLK coming from the CPU 1 with respect to the clock signal CLK, the de-skew circuit 50 controls the phase of a timing signal TCLK to be transmitted to the CPU 1 together with read data, thereby reducing a skew of the timing signal TCLK arriving at the CPU 1. In this way, each of the memories 21 to 23 has the de-skew circuit 5 of FIG. 5 as well as the de-skew circuit 50 of FIG. 9. The de-skew circuit 50 is connected to an input buffer 41c, an output transistor 42c, a latch 43c, and an output buffer 44c. The output buffer 44c may receive a signal having a fixed source voltage Vii.

When transferring data between the CPU 1 and the memories 21 to 23, the timing signal TCLK is sent together with the data. According to information about a skew of the incoming timing signal TCLK, the shift register 52c sets the same delay in the input and output delay circuits 53c and 54c, to realize the same skew reduction effect on the timing signal as that on data signals achieved in the embodiment of FIGS. 4 to 6. Delay in the delay circuits 53c and 54c is set by the shift register 52c in a calibration mode in which the CPU 1 sends the timing signal TCLK to each of the memories 21 to 23. The CPU 1 generates the timing signal TCLK with the use of a switch that is controlled by the synchronous clock signal CLK and sends the signal TCLK to the memories 21 to 23 as indicated with double-arrow marks in FIG. 7.

The details of components that form the de-skew circuit of FIGS. 5 and 9 will be explained.

Figure 10:
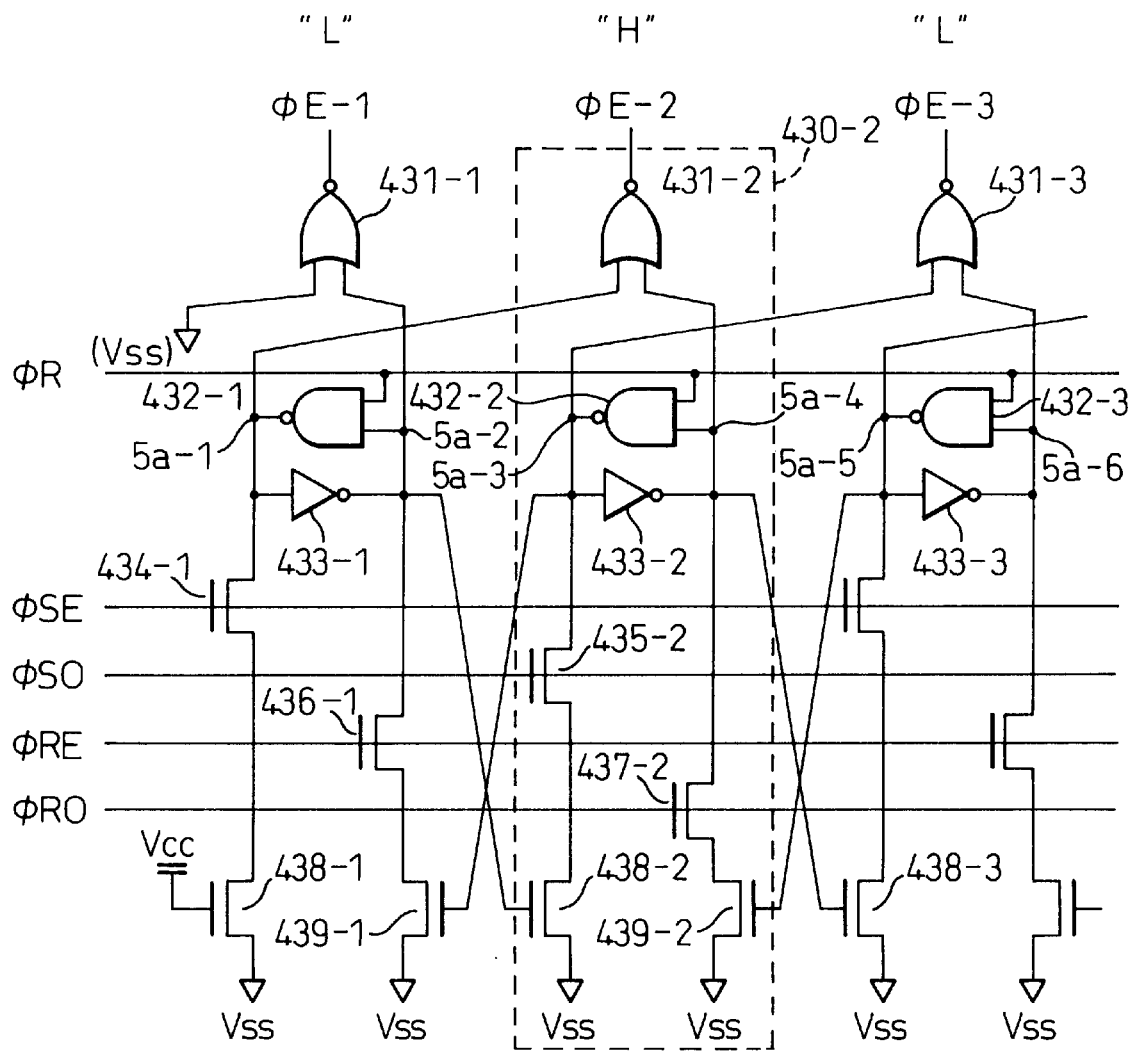
FIG. 10 is a circuit diagram showing a shift register contained in the de-skew circuit of FIGS. 5 and 9.

FIG. 10 is a circuit diagram showing the details of any one of the shift registers 52a, 52b, and 52c of FIGS. 5 and 9.

The shift register consists of one-bit delay controllers 430-1, 430-2, 430-3, and the like. The number of these delay controllers is dependent on the number of delay elements contained in each of the input delay circuits 53a, 53b, and 53c and output delay circuits 54a, 54b, and 54c. The delay controllers 430 provide enable signals φE-1, φE-2, φE-3, and the like, respectively, to enable the corresponding delay elements of the delay circuits. Although FIG. 10 shows only three delay controllers 430-1 to 430-3, the number of the delay controllers contained in the shift register is n that is equal to the number of delay elements contained in each delay circuit. Only one of the enable signals φE-1 to φE-n is set to high and the others are set to low.

The delay controller 430-2 encircled with a dotted line in FIG. 10 will be explained as a typical example. The delay controller 430-2 has a flip-flop made of a NAND gate 432-2 and an inverter 433-2, transistors 435-2, 437-2, 438-2, and 439-2 that are connected in series with the flip-flop, and a NOR gate 431-2. The gate of the transistor 438-2 is connected to a node 5a-2 of the delay controller 430-1, and the gate of the transistor 439-2 is connected to a node 5a-5 of the delay controller 430-3, to receive signals from the adjacent delay controllers. Set signals φSE and φSO used to increase delay and reset signals φRE and φRO used to decrease delay are alternately connected to the delay controllers.

More precisely, in the delay controller 430-2, the gate of the transistor 435-2 receives the set signal φSO, and the gate of the transistor 437-2 receives the reset signal φRO. The delay controllers on each side of the delay controller 430-2 receive the set signal φSE and reset signal φRE. The NOR gate 431-2 receives a signal from a node 5a-1 of the delay controller 430-1 as well as a signal from a node 5a-4 of its own delay controller. A reset signal φR resets all delay controllers in the shift register 52a (52b, 52c). The reset signal φR is temporarily made low when a power source is turned on, and is usually kept high.

Figure 11:
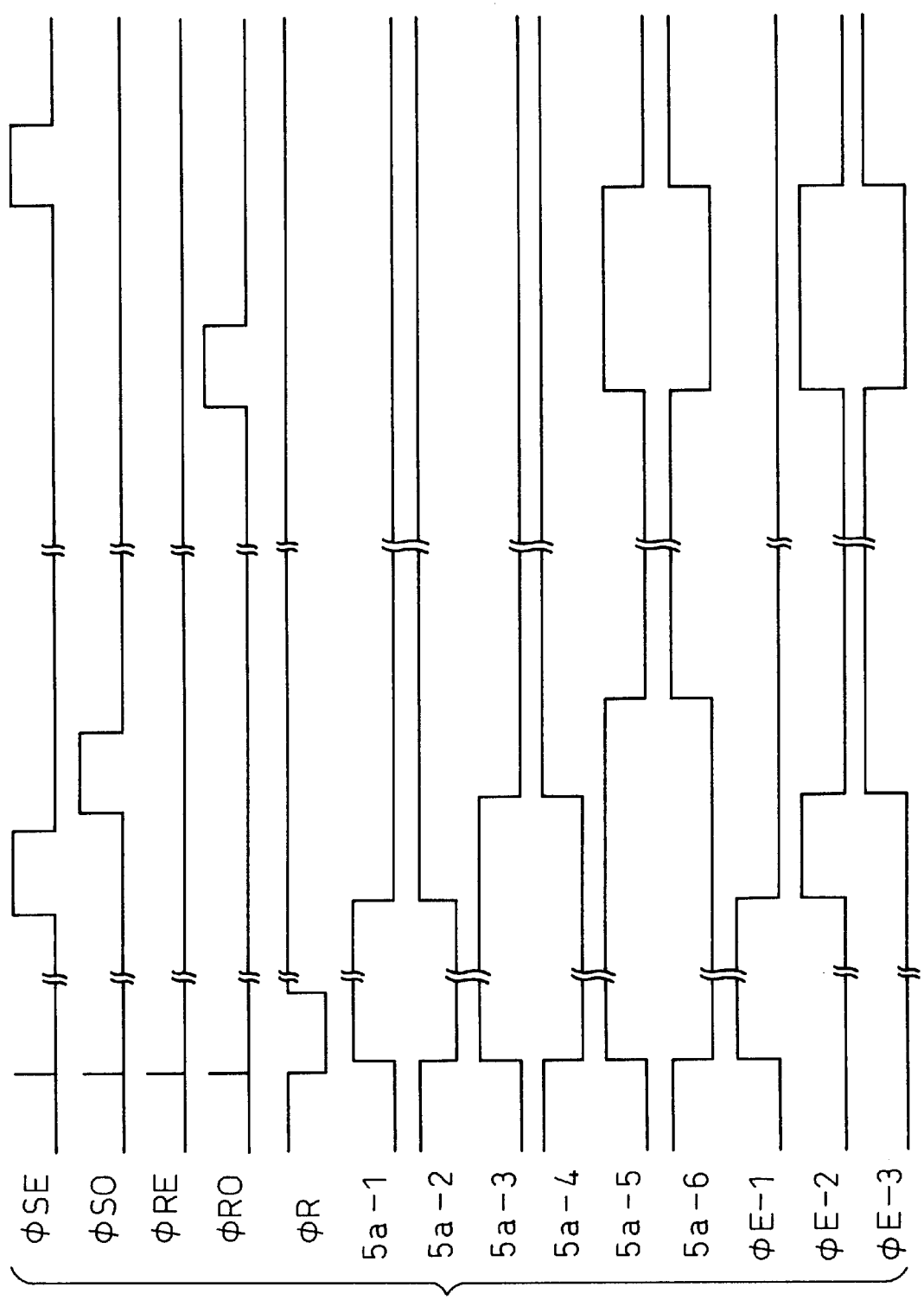
FIG. 11 is a timing chart showing the operation of the shift register of FIG. 10.

FIG. 11 is a timing chart showing the operation of the three delay controllers 430-1 to 430-3 of the shift register of FIG. 10.

The reset signal φR becomes momentarily low to reset the nodes 5a-1, 5a-3, and 5a-5 to high and the nodes 5a-2, 5a-4, and 5a-6 to low. When a delay increase operation is required, the set signals φSE and φSO are alternately set to high and low.

When the set signal φSE rises from low to high, the node 5a-1 is grounded to low. At this time, the node 5a-2 rises to high. As a result, the enable signal φE-1 falls from high to low. This state is latched by the flip-flop of the delay controller 430-1, and therefore, the enable signal φE-1 stays at low even if the set signal φSE returns to low.

When the node 5a-1 changes to low, the enable signal φE-2 rises from low to high. Since the node 5a-2 is high, the transistor 438-2 turns on. When the set signal φSO rises from low to high, the node 5a-3 is grounded to low. At this time, the node 5a-4 changes to high. As a result, the enable signal φE-2 falls from high to low. This state is latched by the flip-flop of the delay controller 430-2, and therefore, the enable signal φE-2 stays at low even if the set signal φSO returns to low.

When the node 5a-3 changes to low, the enable signal φE-3 rises from low to high. Although the set signals φSE and φSO each show one pulse in FIG. 11, they alternately rise to high and fall to low because the shift register contains a plurality of delay controllers. In response to such changes in the set signals φSE and φSO, a high-level one among the enable signals φE-1 to φE-n sequentially shifts to the right to increase delay in the corresponding input and output delay circuits. Namely, if a comparison result provided by the phase comparison circuit 55a (55b, 55c) of FIGS. 5 and 9 instructs to increase delay, the set signals φSE and φSO are alternately made high and low.

If the set signals φSE and φSO and reset signals φRE and φRO are kept low, a high-level position among the enable signals φE-1 to φE-n is fixed. Namely, if a comparison result from the phase comparison circuit 55a (55b, 55c) instructs to maintain the delay, the signals φSE, φSO, φRE, and φRO are kept low.

For a delay decrease operation, the reset signals φRE and φRO are alternately made high and low. Then, a high-level position among the enable signals φE-1 to φE-n sequentially shifts to the left to decrease delay in the corresponding input and output delay circuits. Namely, if a comparison result provided by the phase comparison circuit 55a (55b, 55c) of FIGS. 5 and 9 instructs to decrease delay, the reset signals φRE and φRO are alternately made high and low.

Figure 12:
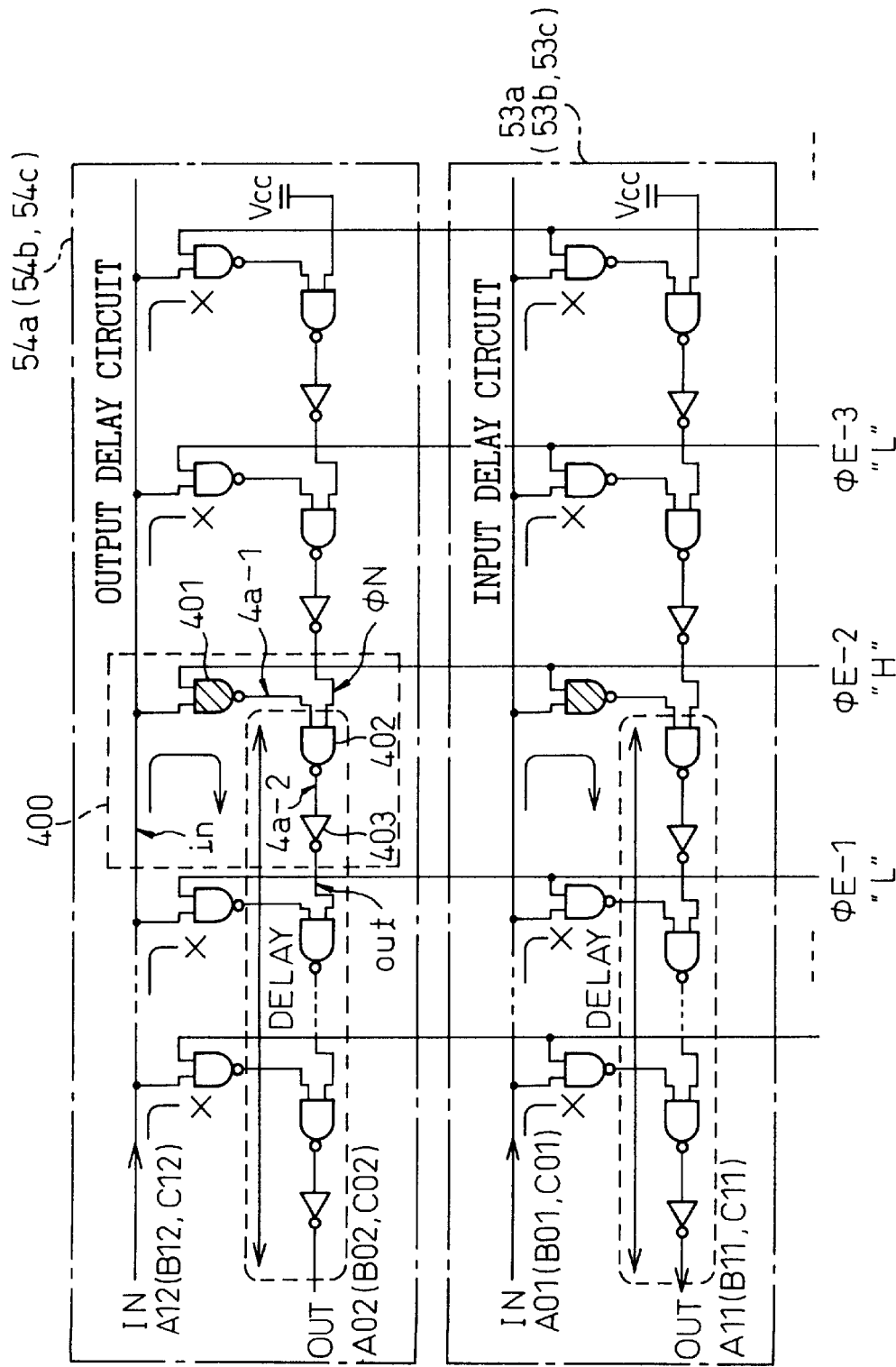
FIG. 12 is a circuit diagram showing an input delay circuit and an output delay circuit contained in the de-skew circuit of FIGS. 5 and 9.
Figure 13:
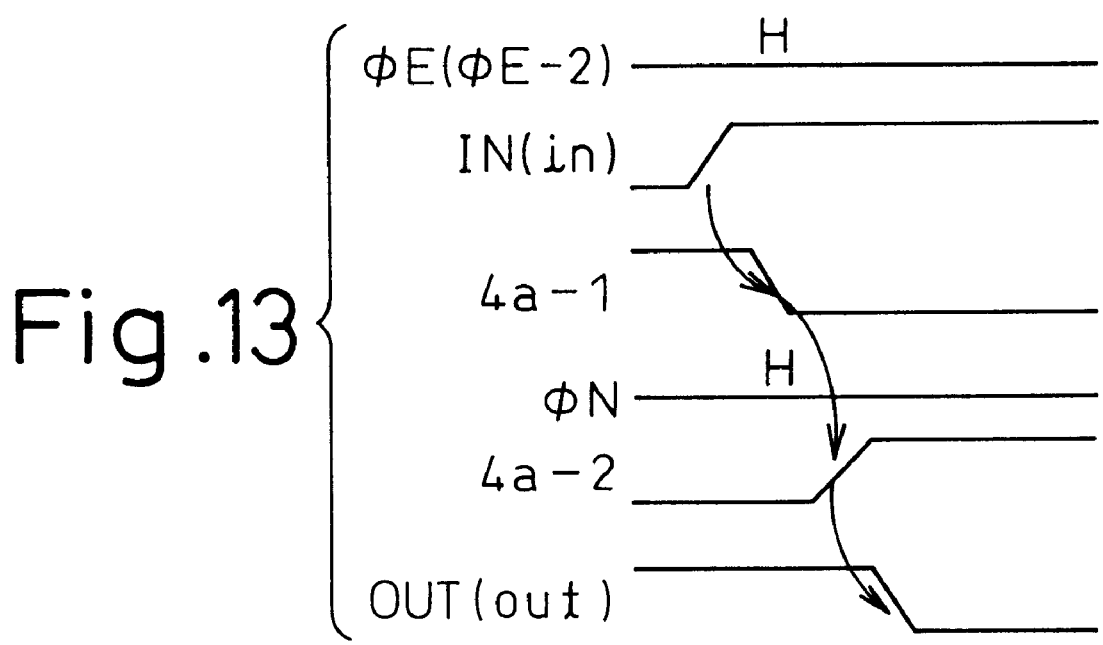
FIG. 13 is a timing chart showing the operation of the delay circuits of FIG. 12.

FIG. 12 is a circuit diagram showing the details of the input delay circuit 53a (53b, 53c) and output delay circuit 54a (54b, 54c) of the de-skew circuit of FIGS. 5 and 9. FIG. 13 is a timing chart showing the operation of one of one-bit delay elements contained in the delay circuits.

Each of the delay circuits consists of n one-bit delay elements, and one delay element 400 encircled with a dotted line in FIG. 12 consists of two NAND gates 401 and 402 and an inverter 403. When an enable signal φE (one of the enable signals φE-1 to φE-n provided by the NOR gates 431-1 to 431-n of FIG. 10) corresponding to the delay element 400 is high, the delay element is activated. Only one of the enable signals φE-1 to φE-n becomes high and the others are each low, to select one delay element in each of the delay circuits 53a (53b, 53c) and 54a (54b, 54c), so that the selected delay element and the delay elements between the selected one and an output end of the delay circuit determine the delay time of the delay circuit. The shift register 52a (52b, 52c) provides the same high and low enable signals to the input and output delay circuits 53a and 54a (53b and 54b, 53c and 54c), to select delay elements at the same position in the input and output delay circuits. As a result, the input and output delay circuits provide the same delay time. In FIG. 12, only the enable signal φE-2 is high, and in each of the delay circuits 53a (53b, 53c) and 54a (54b, 54c), a delay time defined by the delay element specified by the signal φE-2 and the delay elements between the specified one and the output terminal of the delay circuit is applied to an input signal IN (A01, B01, C01; A12, B12, C12) to provide a delayed output signal OUT (A11, B11, C11; A02, B02, C02).

In the delay element 400, an output signal "out" is always low if a signal φN from the right adjacent delay element is low. If the signal φN is high and the signal φE-2 is low, the output signal "out" is high. If the signal φN is high, the signal φE-2 is high, and an input signal "in" is low as shown in FIG. 13, the output signal "out" is high. If the input signal "in" becomes high under the same conditions, the output signal "out" becomes low.

In FIG. 12, each of the input and output delay circuits has several one-bit delay elements that are cascaded. If the input signal "in" or IN rises from low to high, the input signal is passed through the NAND gate 401 to which the enable signal φE-2 of high is applied. At this time, the NAND gates of the other delay elements block the input signal IN.

More precisely, when the NAND gate 401 receives the enable signal φE-2 of high, the NAND gate 401 inverts the input signal IN, and the inverted input signal is supplied as a signal 4a-1 to the NAND gate 402. Since the signal φN provided by the right delay element is high, the NAND gate 402 inverts the signal 4a-1 and provides a signal 4a-2. Further, the inverter 403 inverts the signal 4a-2 and provides an output signal "out" to the left delay element.

Since all enable signals except φE-2 are low, the left delay element inverts the received signal two times through the series-connected NAND gate and inverter and transmits the two-times-inverted signal to the next left delay element. These operations are repeated. Delay caused by the NAND gate and inverter of each delay element is accumulated, and finally, the delay circuit 53a (53b, 53c) or 54a (54b, 54c) provides a delayed output signal OUT.

In this way, an input signal IN is transmitted through an activated one-bit delay element and the delay elements arranged between the activated one and the output terminal of the delay circuit and is provided as an output signal OUT. The delay imposed on the input signal IN is controllable by making one of the enable signals φE-1 to φE-n high. Each delay element in each delay circuit (53a, 53b, 53c, 54a, 54b, 54c) provides a unit delay time that is determined by the NAND gate and inverter incorporated in the delay element. Accordingly, a delay time provided by a given delay circuit that forms a DLL circuit is defined by multiplying the unit delay time by the number of delay elements that pass an input signal.

As explained above, the shift register raises one of the enable signals φE-1 to φE-n in response to the signals φSE, φSO, φRE, and φRO, to control the delay time of the corresponding delay circuits in units of the unit delay time.

Figure 14:
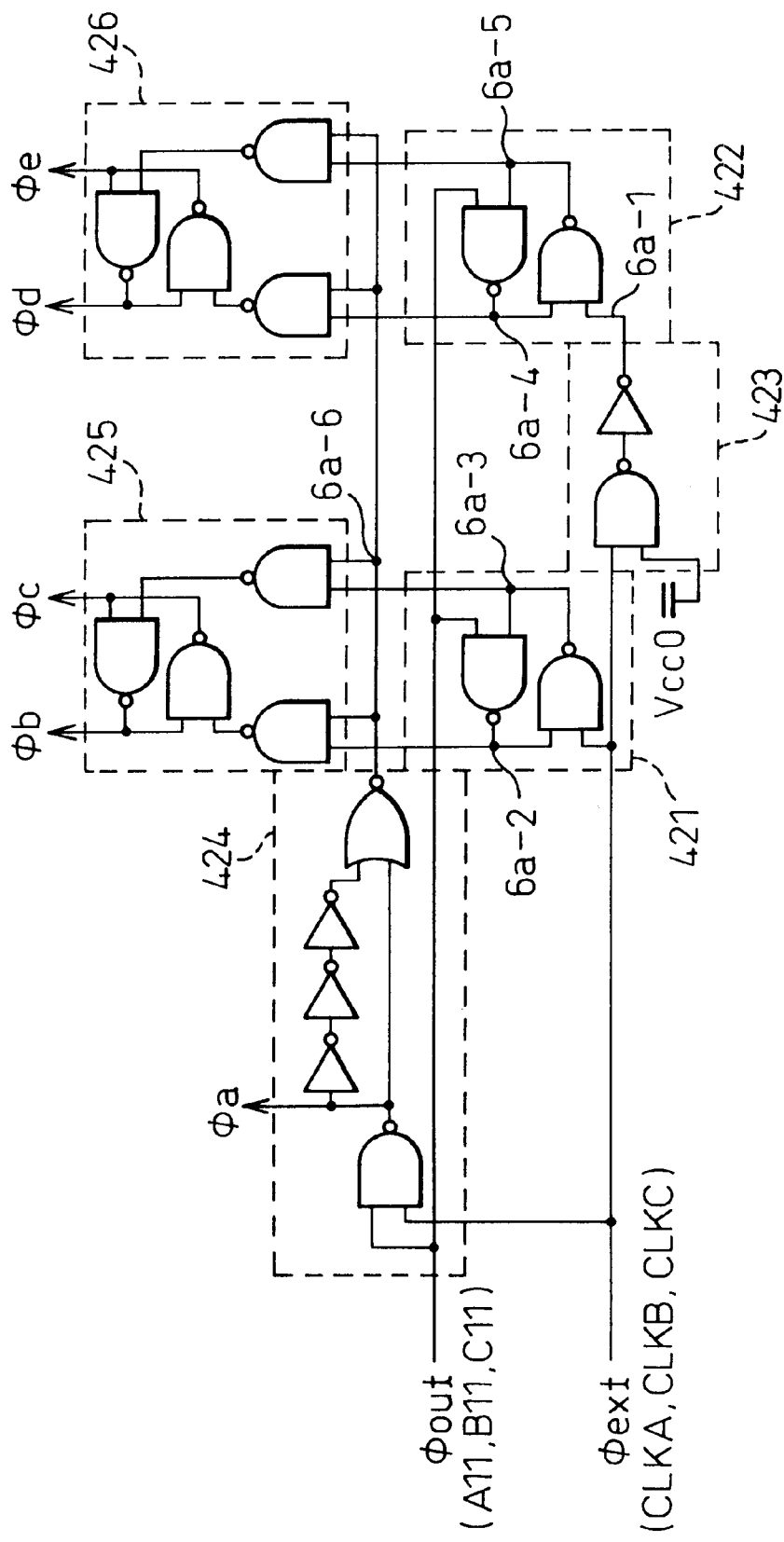
FIG. 14 is a circuit diagram showing a phase comparator in a phase comparison circuit contained in the de-skew circuit of FIGS. 5 and 9.

FIG. 14 is a circuit diagram showing a phase comparator incorporated in the phase comparison circuit 55a (55b, 55c) of the de-skew circuit of FIGS. 5 and 9, and FIGS. 15A to 15C are timing charts showing the operation of the phase comparator of FIG. 14.

Figure 16:
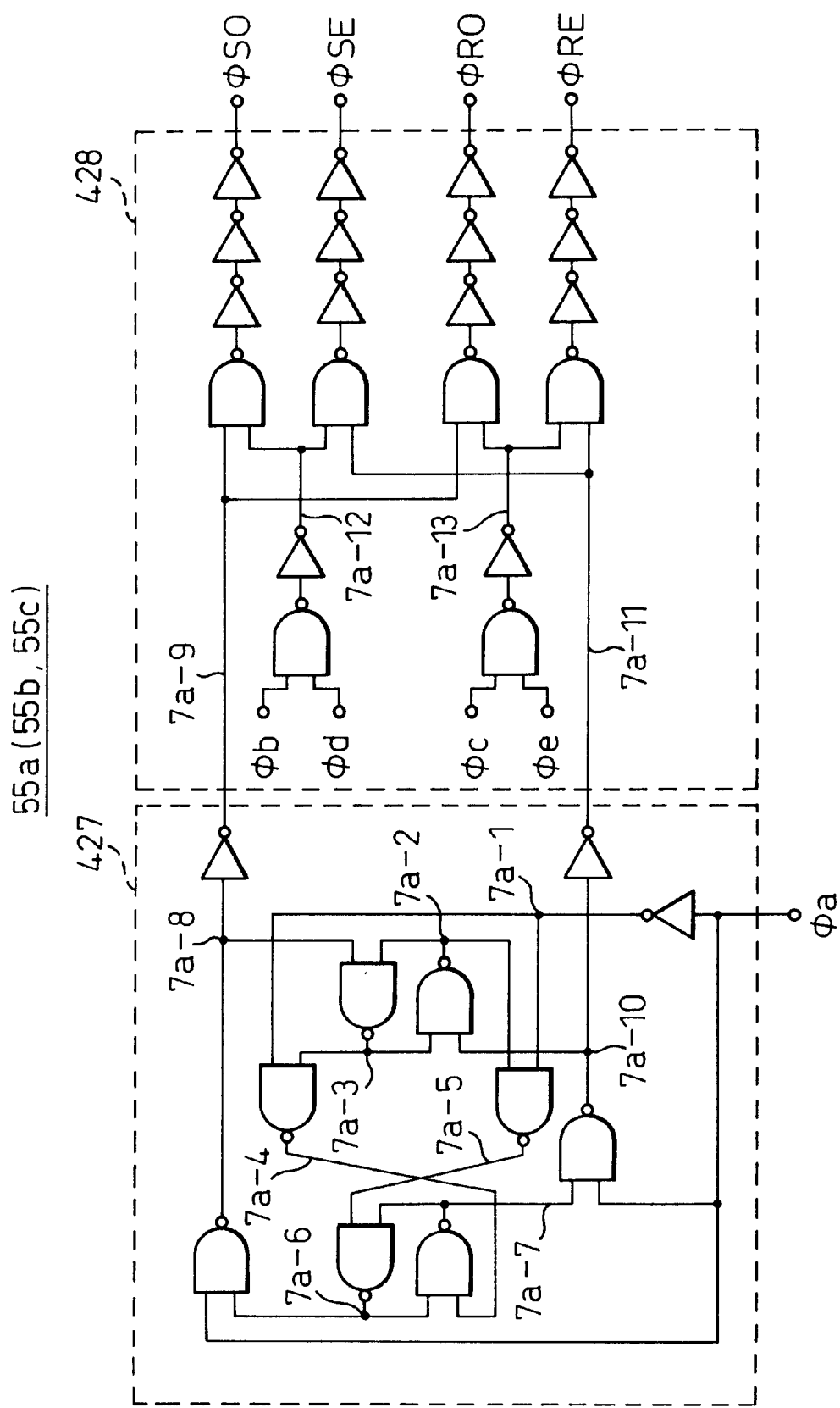
FIG. 16 is a circuit diagram showing a delay setting signal generator in the phase comparison circuit contained in the de-skew circuit of FIGS. 5 and 9.

The phase comparison circuit 55a (55b, 55c) consists of the phase comparator of FIG. 14 and a delay setting signal generator of FIG. 16.

The phase comparator of FIG. 14 compares a target signal φout (A11, B11, C11) with a reference signal φext (CLKA, CLKB, CLKC). Namely, the phase comparator determines the phase of the target signal φout based on the reference signal φext and provides output signals φa to φe to an amplifier that is a part of the delay setting signal generator.

The phase comparator has flip-flops 421 and 422 each having two NAND gates, latches 425 and 426 for latching the states of the flip-flops 421 and 422, a circuit 424 for generating an activation signal for the latches 425 and 426, and a delay circuit 423 for providing the reference signal φext with a phase allowance.

In FIG. 15A, the phase of the target signal φout is ahead of the phase of the reference signal φext. Namely, the target signal φout rises from low to high before the reference signal φext shows the same rise. When the signals φout and φext are each low, nodes 6a-2 to 6a-5 of the flip-flops 421 and 422 are each high. When the target signal φout rises from low to high, the nodes 6a-2 and 6a-4 fall from high to low. Thereafter, the reference signal φext rises from low to high, and a node 6a-1 rises from low to high after a period of delay. At this time, the potential at both ends of the flip-flop 422 is fixed, to cause no change. As a result, the nodes 6a-2, 6a-3, 6a-4, and 6a-5 keep low, high, low, and high, respectively.

When the reference signal φext rises from low to high, the output signal φa of the circuit 424 falls from high to low, so that a node 6a-6 provides a high pulse. The node 6a-6 is connected to an input terminal of each NAND gate of the latches 425 and 426, and therefore, the NAND gates are temporarily activated to latch the potential states of the flip-flops 421 and 422. Finally, the phase comparator of FIG. 14 provides output signals φb, φc, φd, and φe of high, low, high, and low, respectively.

In FIG. 15B, the phase of the target signal φout is substantially equal to the phase of the reference signal φext. Namely, the signals φout and φext substantially simultaneously rise from low to high. During a time difference between the rise of the reference signal φext and a rise at the node 6a-1, the target signal φout rises from low to high. Due to the rise in the reference signal φext, the node 6a-3 of the flip-flop 421 falls from high to low. At this time, the node 6a-1 of the flip-flop 422 is low, and therefore, the node 6a-4 thereof falls from high to low. Thereafter, the node 6a-1 rises from low to high. At this time, the state of the flip-flop 422 is already fixed, and therefore, shows no change. Then, the node 6a-6 provides a high pulse, and the latches 425 and 426 store the states of the flipflops 421 and 422, respectively. Consequently, the phase comparator of FIG. 14 provides output signals φb, φc, φd, and φe of low, high, high, and low, respectively.

In FIG. 15C, the phase of the target signal φout is behind the phase of the reference signal φext. Namely, the target signal φout rises from low to high after the reference signal φext shows the same rise. In this case, the reference signal φext changes the flip-flops 421 and 422. Namely, the nodes 6a-3 and 6a-5 fall from high to low. Consequently, the phase comparator of FIG. 14 provides output signals φb, φc, φd, and φe of low, high, low, and high, respectively.

In this way, the phase comparator determines whether a rise of the target signal φout is ahead of, substantially equal to, or behind a corresponding rise of the reference signal φext, and provides output signals φb, φc, φd, and φe accordingly. These output signals are used to determine the number of delay controllers to be activated in the corresponding shift register.

Figure 17:
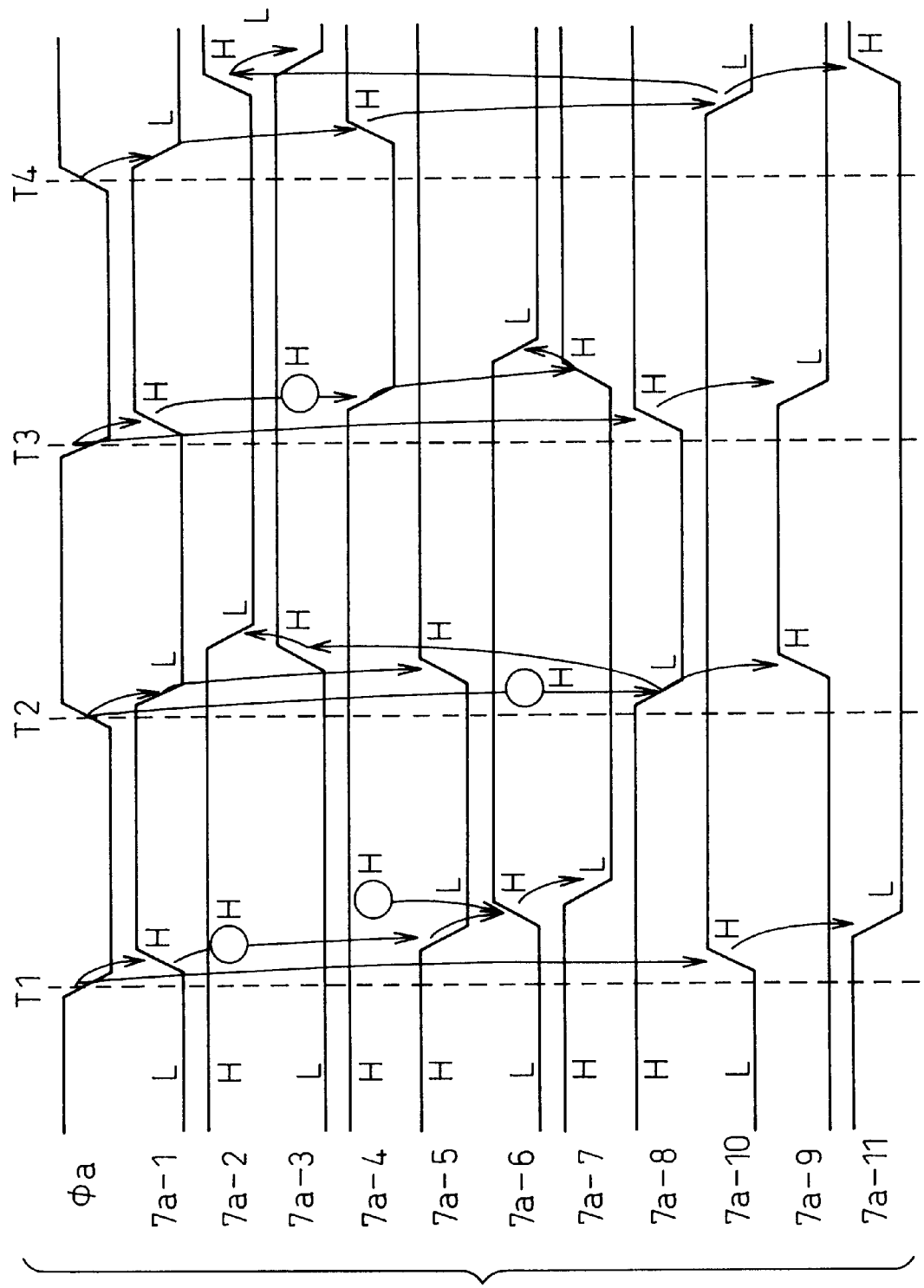
FIG. 17 is a timing chart showing the operation of a JK flip-flop contained in the delay setting signal generator of FIG. 16.

FIG. 16 shows the delay setting signal generator incorporated in the phase comparison circuit 55a (55b, 55c) of the de-skew circuit of FIGS. 5 and 9, and FIG. 17 is a timing chart showing the operation of a JK flip-flop that is a part of the delay setting signal generator.

The delay setting signal generator consists of the JK flip-flop 427 and an amplifier 428 made of NAND gates and inverters. In response to the signal φa from the phase comparator of FIG. 14, the JK flip-flop 427 alternately makes output nodes 7a-9 and 7a-11 high and low. The amplifier 428 amplifies the outputs of the JK flip-flop 427 and the signals φb to φe.

FIG. 17 is a timing chart showing the operation of the JK flip-flop 427. At time T1, the signal φa falls from high to low, and then, nodes 7a-1 and 7a-10 rise from low to high. When the node 7a-1 shows the rise, nodes 7a-5, 7a-6, and 7a-7 change accordingly. Since the signal φa is low at this moment, a node 7a-8 shows no change. As a result, the output node 7a-9 shows no change, and only the output node 7a-11 falls from high to low. At time T2, the signal φa rises from low to high. Then, the node 7a-8 falls from high to low. The node 7a-10 shows no change because the node 7a-7 is unchanged. Accordingly, the output node 7a-9 rises from low to high, and the output 7a-11 is unchanged. In this way, the output nodes 7a-9 and 7a-11 alternately become high and low in response to changes in the signal φa.

Figure 18:
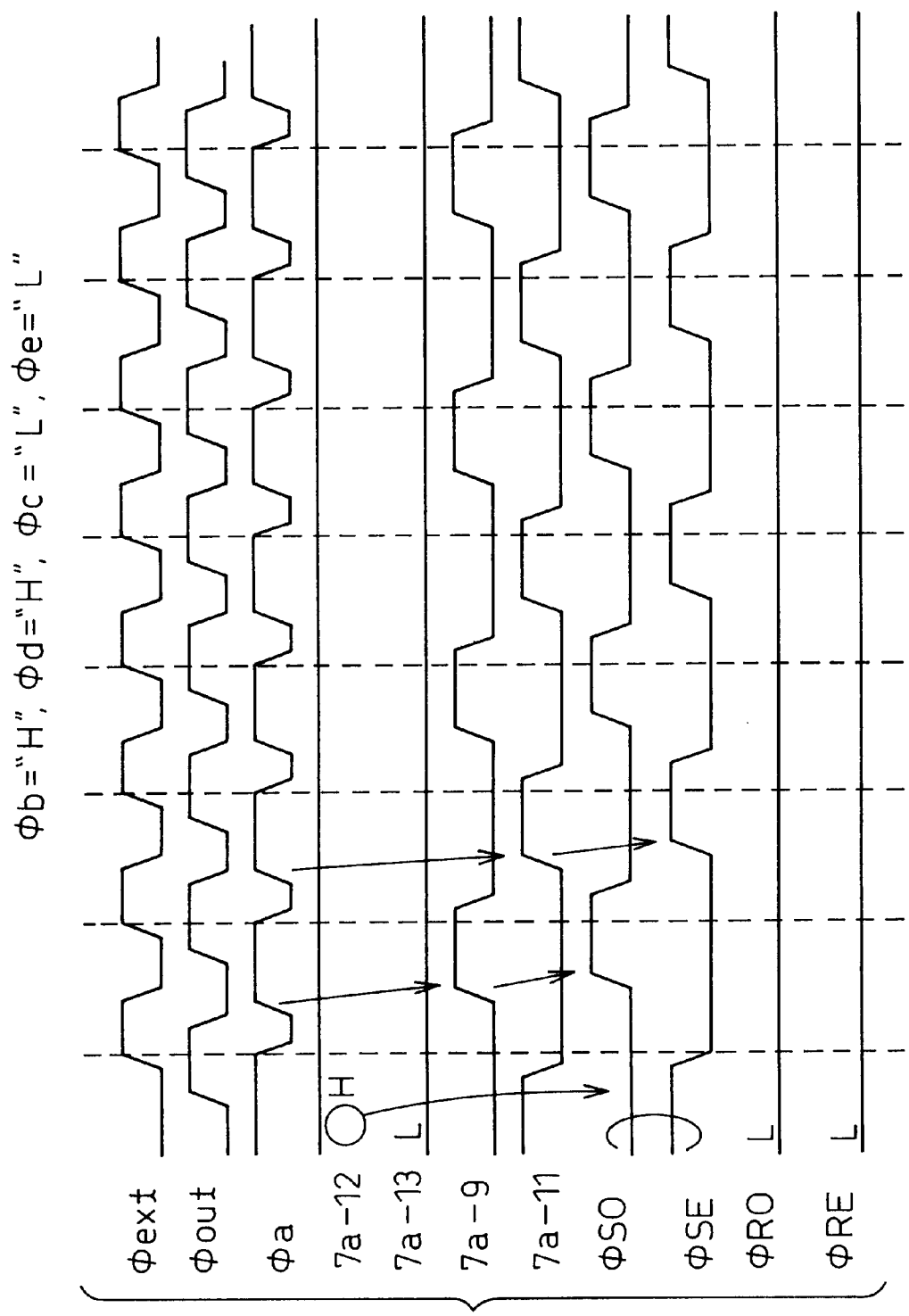
FIG. 18 is a timing chart showing a delay increase operation of the delay setting signal generator of FIG. 16.
Figure 19:
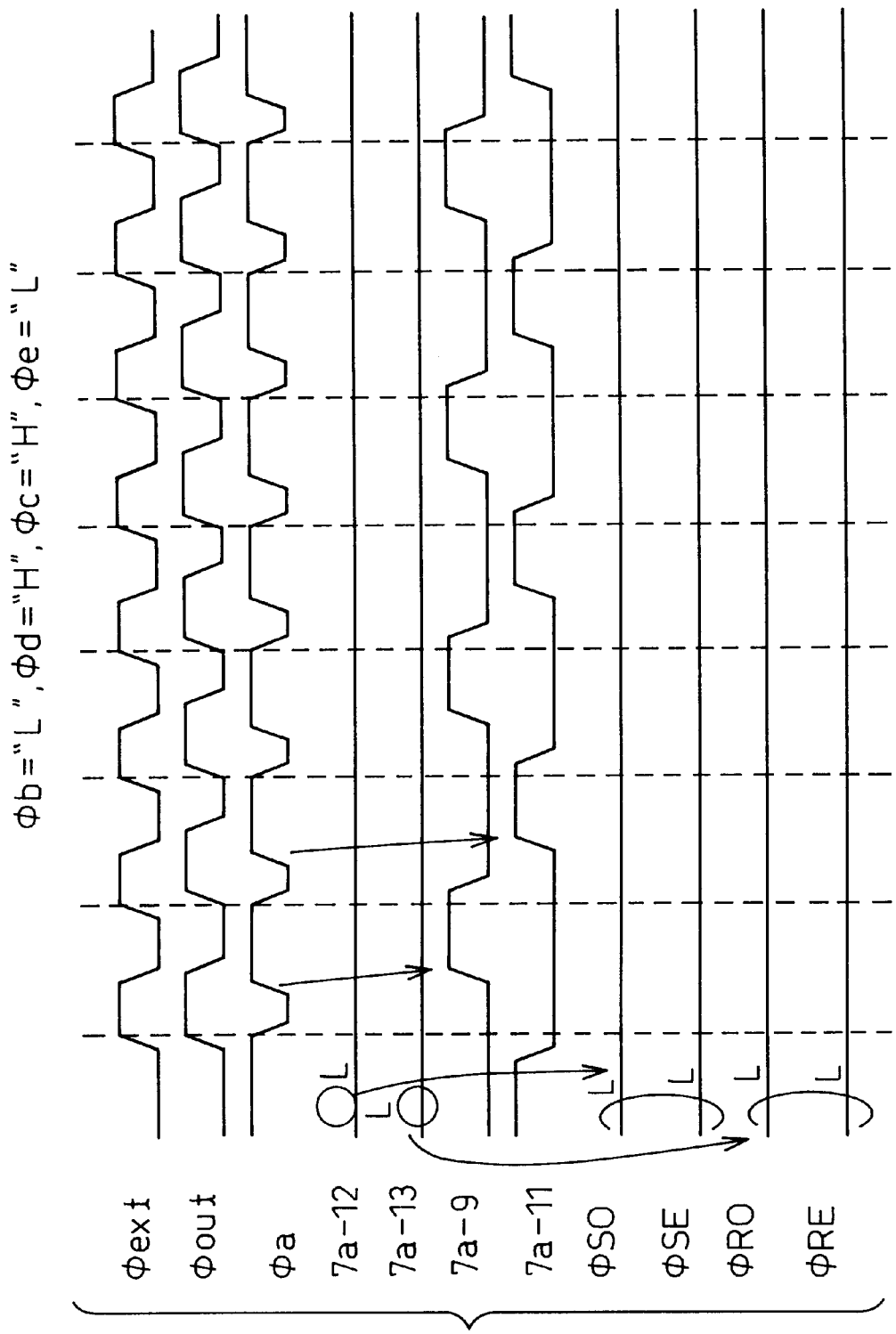
FIG. 19 is a timing chart showing a delay sustain operation of the delay setting signal generator of FIG. 16.
Figure 20:
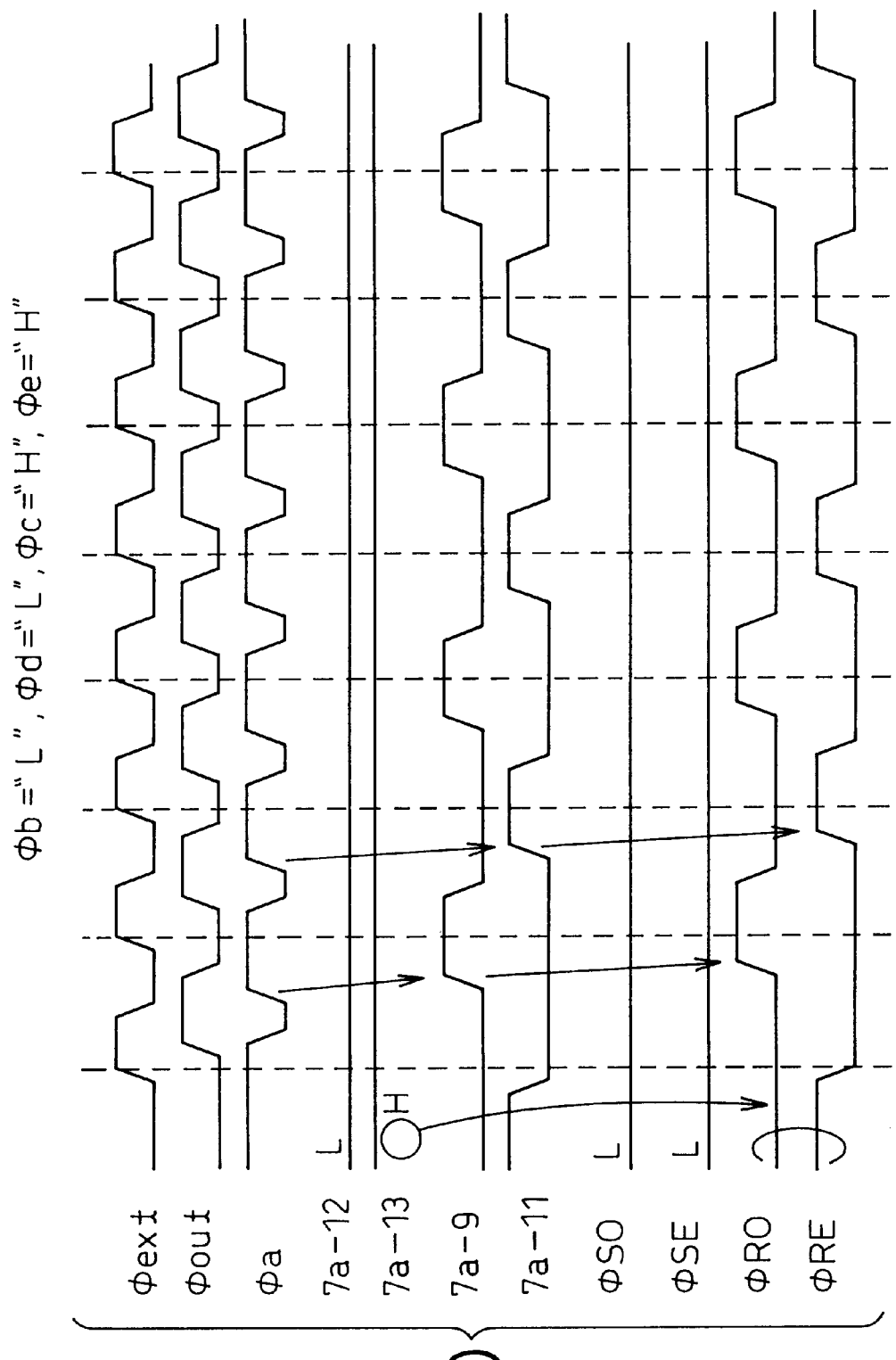
FIG. 20 is a timing chart showing a delay decrease operation of the delay setting signal generator of FIG. 16.

FIG. 18 is a timing chart showing a delay increase operation of the delay setting signal generator of FIG. 16, FIG. 19 is a timing chart showing a delay sustain operation of the same, and FIG. 20 is a timing chart showing a delay decrease operation of the same. The operation of the amplifier 428 of the delay setting signal generator will be explained with reference to FIGS. 18 to 20.

In FIG. 18, the target signal φout rises from low to high before the reference signal φext shows the same rise. In this case, the phase comparator of FIG. 14 provides output signals φb, φc, φd, and φe of high, low, high, and low, respectively. As a result, a node 7a-12 becomes high and a node 7a-13 is fixed at low. Then, the set signals φSO and φSE change according to the state of the JK flip-flop 427, and the reset signals φRO and φRE are unchanged because the node 7a-13 is kept at low. This results in shifting an active delay controller in the corresponding shift register to the right to increase delay in the corresponding input and output delay circuits.

In FIG. 19, the target signal φout and reference signal φext substantially simultaneously rise from low to high. In this case, the phase comparator of FIG. 14 provides output signals φb, φc, φd, and φe of low, high, high, and low, respectively. As a result, the nodes 7a-12 and 7a-13 are fixed at low, and therefore, the signals φSO, φSE, φRO, and φRE are fixed at low. This results in causing no shift in the corresponding shift register and no change in delay in the corresponding input and output delay circuits.

In FIG. 20, the target signal φout rises from low to high after the reference signal φext shows the same rise. In this case, the phase comparator of FIG. 14 provides output signals φb, φc, φd, and φe of low, high, low, and high, respectively. As a result, the node 7a-12 is fixed at low and the node 7a-13 at high. Consequently, the reset signals φRO and φRE change according to the state of the JK flip-flop 427, and the set signals φSO and φSE are unchanged because the node 7a-12 is fixed at low. This results in shifting an active delay controller in the corresponding shift register to the left to decrease delay in the corresponding input and output delay circuits.

As explained above, the present invention provides a semiconductor integrated circuit such as a memory capable of reducing a skew of write data provided by a CPU and using information about the skew, to reduce a skew of data read out of the memory and arriving at the CPU. Although the semiconductor integrated circuits of the embodiments mentioned above are memories, the present invention is applicable to various kinds of semiconductor integrated circuits that involve a skew of signals with respect to a synchronous clock signal.

In this way, the present invention reduces a skew of signals sent from a specific circuit to a semiconductor integrated circuit and uses information about the skew, to reduce a skew of signals arriving at the specific circuit from the semiconductor integrated circuit. The present invention thus improves the operation speed of the semiconductor integrated circuit.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit comprising a de-skew circuit for reducing a skew of an input signal transmitted from a specific circuit with respect to a synchronous clock signal, wherein:

said de-skew circuit controls a phase of an output signal to be transmitted from said semiconductor integrated circuit to said specific circuit in response to the skew of the input signal.

2. A semiconductor integrated circuit as claimed in claim 1, wherein said de-skew circuit comprises:

an input delay circuit for imposing a delay on the input signal, to cancel the skew of the input signal; and an output delay circuit for imposing, on the output signal, the same delay as that imposed by said input delay circuit.

3. A semiconductor integrated circuit as claimed in claim 2, wherein each of said input and output delay circuits forms a delay locked loop circuit.

4. A semiconductor integrated circuit as claimed in claim 3, wherein said de-skew circuit further comprises:

a phase comparison circuit for detecting the skew of the input signal; and a shift register for setting the same delay in said input and output delay circuits according to the detected skew.

5. A semiconductor integrated circuit as claimed in claim 2, wherein said semiconductor integrated circuit executes a calibration mode to correct the skew of the input signal.

6. A semiconductor integrated circuit as claimed in claim 1, wherein said semiconductor integrated circuit transmits a timing signal together with the output signal to said specific circuit.

7. A semiconductor integrated circuit as claimed in claim 6, wherein said semiconductor integrated circuit executes a calibration mode to correct a skew of the timing signal with respect to the synchronous clock signal.

8. A semiconductor integrated circuit as claimed in claim 7, wherein said specific circuit transmits a timing signal to said semiconductor integrated circuit in the calibration mode.

9. A semiconductor integrated circuit as claimed in claim 8, wherein said de-skew circuit further comprises:

an input delay circuit for imposing a delay on the timing signal transmitted from said specific circuit in the calibration mode, to cancel a skew of the timing signal with respect to the synchronous clock signal; and an output delay circuit for imposing, on the timing signal transmitted from said semiconductor integrated circuit to said specific circuit, the same delay as that imposed by said input delay circuit.

10. A semiconductor integrated circuit as claimed in claim 9, wherein each of said input and output delay circuits for the timing signals forms a delay locked loop circuit.

11. A semiconductor integrated circuit as claimed in claim 10, wherein said de-skew circuit further comprises:

a phase comparison circuit for detecting the skew of the timing signal transmitted from said specific circuit; and a shift register for setting the same delay in said input and output delay circuits for the timing signals according to the detected skew.

12. A semiconductor integrated circuit as claimed in claim 1, wherein said specific circuit is a central processing unit and said semiconductor integrated circuit is a memory connected to said central processing unit through buses.

13. A semiconductor integrated circuit system having a plurality of semiconductor integrated circuits and a specific circuit, each of said semiconductor integrated circuits including a de-skew circuit for reducing a skew of an input signal transmitted from said specific circuit with respect to a synchronous clock signal, wherein:

said de-skew circuit controls a phase of an output signal to be transmitted from said semiconductor integrated circuit to said specific circuit in response to the skew of the input signal.

14. A semiconductor integrated circuit system as claimed in claim 13, wherein said specific circuit is a central processing unit and each of said semiconductor integrated circuits is a memory connected to said central processing unit through buses.

15. A semiconductor integrated circuit system as claimed in claim 13, wherein said de-skew circuit comprises:

an input delay circuit for imposing a delay on the input signal, to cancel the skew of the input signal; and an output delay circuit for imposing, on the output signal, the same delay as that imposed by said input delay circuit.

16. A semiconductor integrated circuit system as claimed in claim 15, wherein each of said input and output delay circuits forms a delay locked loop circuit.

17. A semiconductor integrated circuit system as claimed in claim 16, wherein said de-skew circuit further comprises:

a phase comparison circuit for detecting the skew of the input signal; and a shift register for setting the same delay in said input and output delay circuits according to the detected skew.

18. A semiconductor integrated circuit system as claimed in claim 15, wherein each of said semiconductor integrated circuits executes a calibration mode to correct the skew of the input signal.

19. A semiconductor integrated circuit system as claimed in claim 13, wherein each of said semiconductor integrated circuits transmits a timing signal together with the output signal to said specific circuit.

20. A semiconductor integrated circuit system as claimed in claim 16, wherein each of said semiconductor integrated circuits executes a calibration mode to correct a skew of the timing signal with respect to the synchronous clock signal.

21. A semiconductor integrated circuit system as claimed in claim 20, wherein said specific circuit transmits a timing signal to said semiconductor integrated circuits in the calibration mode.

22. A semiconductor integrated circuit system as claimed in claim 21, wherein said de-skew circuit further comprises:

an input delay circuit for imposing a delay on the timing signal transmitted from said specific circuit in the calibration mode, to cancel a skew of the timing signal with respect to the synchronous clock signal; and an output delay circuit for imposing, on the timing signal transmitted from said semiconductor integrated circuits to said specific circuit, the same delay as that imposed by said input delay circuit.

23. A semiconductor integrated circuit system as claimed in claim 22, wherein each of said input and output delay circuits for the timing signals forms a delay locked loop circuit.

24. A semiconductor integrated circuit system as claimed in claim 23, wherein said de-skew circuit further comprises:

a phase comparison circuit for detecting the skew of the timing signal transmitted from said specific circuits; and a shift register for setting the same delay in said input and output delay circuits for the timing signals according to the detected skew.

\* \* \* \* \*